United States Patent
Agarwal et al.

(10) Patent No.: US 10,055,267 B2
(45) Date of Patent: Aug. 21, 2018

(54) BLOCK MANAGEMENT SCHEME TO HANDLE CLUSTER FAILURES IN NON-VOLATILE MEMORY

(71) Applicant: SanDisk Technologies LLC, Plano, TX (US)

(72) Inventors: Dinesh Kumar Agarwal, Bangalore (IN); Ramkumar Ramamurthy, Bangalore (IN); Vijay Sivasankaran, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/638,860

(22) Filed: Mar. 4, 2015

(65) Prior Publication Data

US 2016/0259570 A1 Sep. 8, 2016

(51) Int. Cl.

| G06F 3/06 | (2006.01) |
| G06F 11/00 | (2006.01) |
| G11C 29/08 | (2006.01) |
| G11C 29/44 | (2006.01) |
| G11C 29/00 | (2006.01) |
| G11C 8/12 | (2006.01) |
| G11C 16/08 | (2006.01) |
| G11C 29/04 | (2006.01) |

(52) U.S. Cl.
CPC .............. *G06F 11/00* (2013.01); *G11C 29/08* (2013.01); *G11C 29/4401* (2013.01); *G11C 29/76* (2013.01); *G11C 8/12* (2013.01); *G11C 16/08* (2013.01); *G11C 2029/0409* (2013.01)

(58) Field of Classification Search
CPC .. G06F 3/0617; G06F 3/0604; G06F 12/0246; G06F 3/064; G06F 3/0679
See application file for complete search history.

(56) References Cited

U.S. PATENT DOCUMENTS

| 4,608,687 A | 8/1986 | Dutton |
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |

(Continued)

OTHER PUBLICATIONS

Che-Wei Tsao, Yuan-Hao Chang, and Ming-Chang Yang. 2013. Performance enhancement of garbage collection for flash storage devices: an efficient victim block selection design. In Proceedings of the 50th Annual Design Automation Conference (DAC '13). ACM, New York, NY, USA, Article 165, 6 pages. DOI=http://dx.doi.org/10.1145/2463209.2488938.*

(Continued)

*Primary Examiner* — Ramon A. Mercado
(74) *Attorney, Agent, or Firm* — Stoel Rives LLP

(57) ABSTRACT

In a non-volatile memory system, such as flash memory, when selecting a block for write operation, the system selects blocks from a free block list (FBL). The memory circuits of non-volatile systems often experience cluster failures, where multiple blocks of a physical region are bad. If the free block list is loaded with blocks from a region having a cluster failure, this can result in multiple back to back write errors. To help avoid this situation, the blocks of a memory array are divided into physical zones and, when selecting blocks to replenish the free block list, blocks are chosen cyclically from the zones.

20 Claims, 24 Drawing Sheets

(56) References Cited

U.S. PATENT DOCUMENTS

| | | | |
|---|---|---|---|
| 5,343,063 A | 8/1994 | Yuan et al. | |
| 5,559,956 A | 9/1996 | Sukegawa | |
| 5,568,423 A * | 10/1996 | Jou | G06F 12/0246 365/185.11 |
| 5,570,315 A | 10/1996 | Tanaka et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,052,815 A | 4/2000 | Zook | |
| 6,125,467 A | 9/2000 | Dixon | |
| 6,222,762 B1 | 4/2001 | Guterman et al. | |
| 6,311,305 B1 | 10/2001 | Sollish et al. | |
| 6,349,390 B1 | 2/2002 | Dell et al. | |
| 6,357,030 B1 | 3/2002 | Demura et al. | |
| 6,442,726 B1 | 8/2002 | Knefel | |
| 6,477,616 B1 * | 11/2002 | Takahashi | G06F 3/0611 711/103 |
| 6,604,220 B1 | 8/2003 | Lee | |
| 6,870,768 B2 | 3/2005 | Cernea et al. | |
| 6,907,508 B2 * | 6/2005 | Dearth | G06F 12/023 711/119 |
| 7,224,604 B2 * | 5/2007 | Lasser | G06F 12/0246 365/185.09 |
| 7,797,481 B2 * | 9/2010 | Lee | G06F 12/0246 711/103 |
| 7,818,701 B1 * | 10/2010 | Kolokowsky | G06F 12/0246 711/173 |
| 7,826,274 B2 | 11/2010 | Aritome | |
| 7,913,032 B1 * | 3/2011 | Cornwell | G06F 12/0246 711/103 |
| 7,924,666 B2 | 4/2011 | Nakamura | |
| 8,094,500 B2 * | 1/2012 | Paley | G06F 12/0246 365/185.11 |
| 8,250,333 B2 * | 8/2012 | Gorobets | G06F 12/0246 711/103 |
| 8,266,396 B2 * | 9/2012 | Yano | G06F 12/0246 711/103 |
| 8,352,840 B2 | 1/2013 | Crozier et al. | |
| 8,667,358 B2 | 3/2014 | Resnick | |
| 8,725,935 B2 * | 5/2014 | Huang | G11C 7/1042 711/103 |
| 8,873,288 B2 | 10/2014 | Sharon et al. | |
| 2002/0085418 A1 | 7/2002 | Goto et al. | |
| 2002/0194451 A1 * | 12/2002 | Mukaida | G06F 12/0246 711/203 |
| 2003/0065899 A1 * | 4/2003 | Gorobets | G06F 3/0613 711/165 |
| 2004/0083335 A1 * | 4/2004 | Gonzalez | G06F 12/0246 711/103 |
| 2005/0144357 A1 * | 6/2005 | Sinclair | G06F 12/0246 711/103 |
| 2006/0126383 A1 | 6/2006 | Shappir et al. | |
| 2007/0091677 A1 | 4/2007 | Lasser et al. | |
| 2007/0260837 A1 * | 11/2007 | Hsu | G06F 12/1441 711/163 |
| 2007/0288687 A1 | 12/2007 | Panabaker | |
| 2008/0177948 A1 * | 7/2008 | Mimatsu | G06F 17/30079 711/117 |
| 2009/0021978 A1 | 1/2009 | Lin et al. | |
| 2009/0089491 A1 * | 4/2009 | Hatanaka | G06F 12/0246 711/103 |
| 2009/0113120 A1 | 4/2009 | Murin et al. | |
| 2010/0088461 A1 * | 4/2010 | Yang | G06F 12/0246 711/103 |
| 2010/0172179 A1 * | 7/2010 | Gorobets | G06F 12/0246 365/185.09 |
| 2010/0172180 A1 | 7/2010 | Paley et al. | |
| 2010/0174845 A1 | 7/2010 | Gorobets et al. | |
| 2010/0174846 A1 * | 7/2010 | Paley | G06F 12/0246 711/103 |
| 2010/0174847 A1 * | 7/2010 | Paley | G06F 12/0246 711/103 |
| 2010/0211820 A1 * | 8/2010 | Kim | G06F 12/0246 714/5.1 |
| 2011/0032774 A1 * | 2/2011 | Yan | G11C 7/18 365/189.05 |
| 2011/0099460 A1 | 4/2011 | Dusija et al. | |
| 2011/0149650 A1 * | 6/2011 | Huang | G06F 12/0246 365/185.03 |
| 2011/0161560 A1 * | 6/2011 | Hutchison | G06F 12/0246 711/103 |
| 2011/0302361 A1 * | 12/2011 | Yamazaki | G11C 16/349 711/103 |
| 2012/0079169 A1 * | 3/2012 | Shen | G06F 12/0246 711/103 |
| 2012/0320679 A1 | 12/2012 | Sprouse et al. | |
| 2013/0173842 A1 * | 7/2013 | Ng | G06F 12/0246 711/103 |
| 2013/0173844 A1 * | 7/2013 | Chen | G06F 12/0246 711/103 |
| 2013/0232296 A1 * | 9/2013 | Yonezawa | G06F 12/0246 711/103 |
| 2013/0254459 A1 * | 9/2013 | Laplace | G06F 21/53 711/103 |
| 2013/0282967 A1 * | 10/2013 | Ramanujan | G11C 16/06 711/103 |
| 2014/0164878 A1 | 6/2014 | Tam | |
| 2014/0164879 A1 | 6/2014 | Tam | |
| 2015/0032944 A1 * | 1/2015 | Chu | G06F 12/0246 711/103 |
| 2015/0186072 A1 * | 7/2015 | Darragh | G06F 3/0653 711/103 |
| 2016/0188233 A1 * | 6/2016 | Chiao | G06F 3/0679 711/103 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

Final Office Action in U.S. Appl. No. 13/754,644 dated Nov. 21, 2014, 13 pages.

Office Action in U.S. Appl. No. 13/754,627 dated Aug. 7, 2014, 14 pages.

Office Action in U.S. Appl. No. 13/754,644 dated Jun. 13, 2014, 8 pages.

* cited by examiner

Programming into four states represented by a 2-bit Code

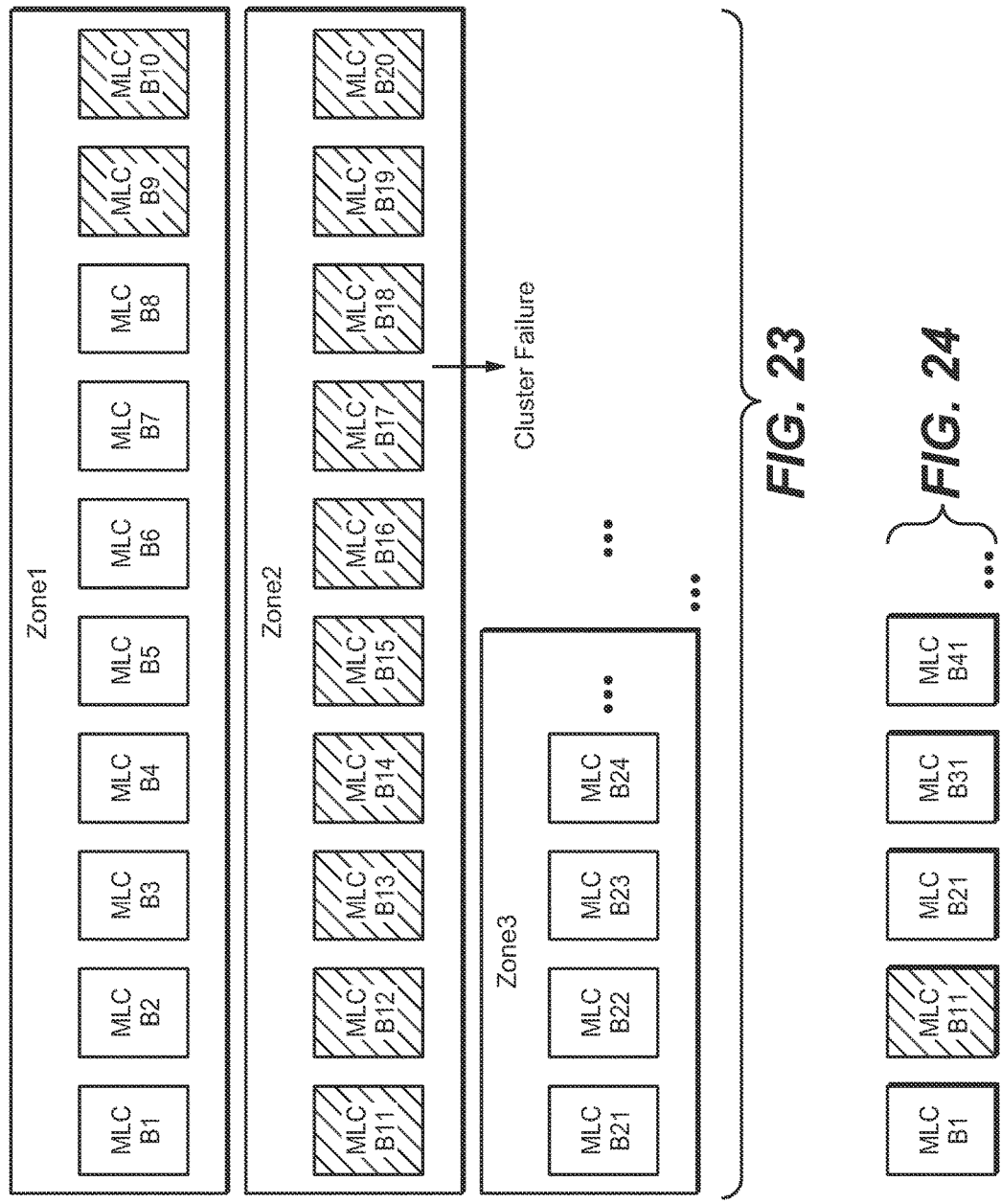

BLOCK MANAGEMENT SCHEME TO HANDLE CLUSTER FAILURES IN NON-VOLATILE MEMORY

BACKGROUND

The following relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

Defects in a memory device will often occur as "cluster failures", where multiple physically adjacent blocks are completely bad or partially bad, so that all the blocks in the cluster result in some kind of error after data is written to these blocks. When selecting free blocks for a write operation, if the memory systems takes a number of free blocks from the area of the cluster failure, this can lead to repeated errors in the write process. Consequently, it would be useful to avoid such cluster failures when selecting free blocks for programming.

SUMMARY

Methods are presented for the operating a non-volatile memory system having an array of multi-cell erase blocks. The array is logically divided into a plurality of multi-block zones, the blocks of each zone being physically adjacent. The memory system maintains a free block list, where, when selecting a block in which to perform a write operation, the memory system selects blocks from the free block list. A first block is chosen from free block list for a write operation and in response to choosing the first block from the free block list for the write operation, a block is selected for inclusion in the free block list, wherein blocks are selected for inclusion in the free block list cyclically from among the zones having one or more blocks without valid.

A controller circuit is for use in a non-volatile memory system also having one or more memory circuits including an array of multi-cell erase blocks. When controlling operations within the array, the controller circuit logically divides the array into a plurality of multi-block zones, the blocks of each zone being physically adjacent; maintains a free block list, wherein, when selecting a block in which to perform a write operation, the memory system selects blocks from the free block list; chooses a first block from the free block list for a write operation; and in response to choosing the first block from the free block list for the write operation, selects a block for inclusion in the free block list, wherein blocks are selected for inclusion in the free block list cyclically from among the zones having one or more blocks without valid data.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 23 is an example of dividing a device's blocks into zones.

FIG. 24 illustrates the construction of a free block list cyclically from zones.

DETAILED DESCRIPTION

Memory System

Figure 1:
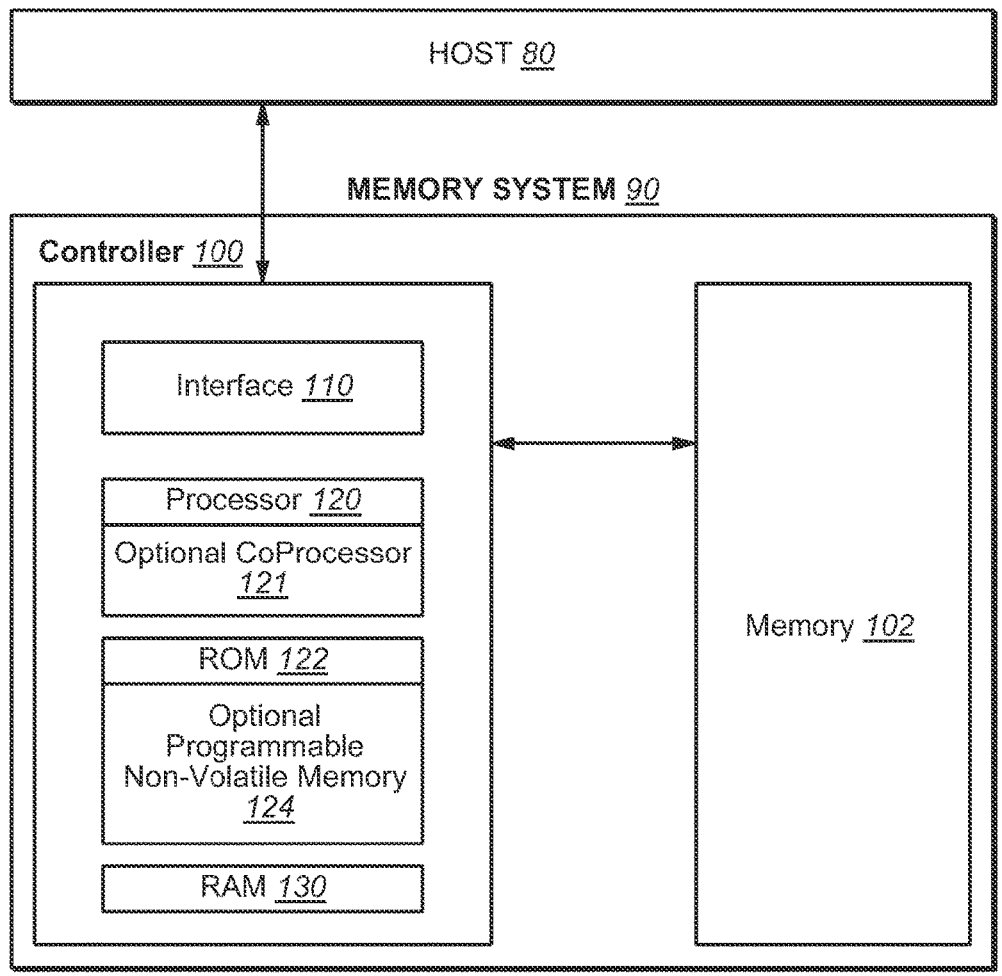
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
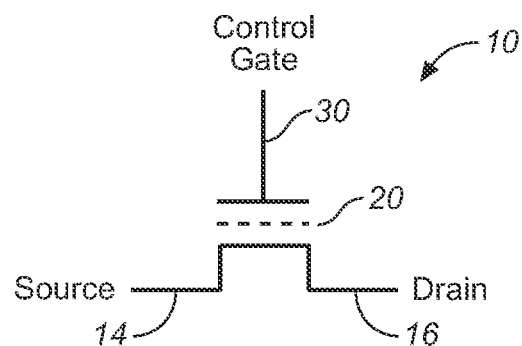
FIG. 2 illustrates schematically a non-volatile memory cell.

It will be recognized that the following is not limited to the two dimensional and three dimensional exemplary structures described but cover all relevant memory structures within the spirit and scope as described herein
Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
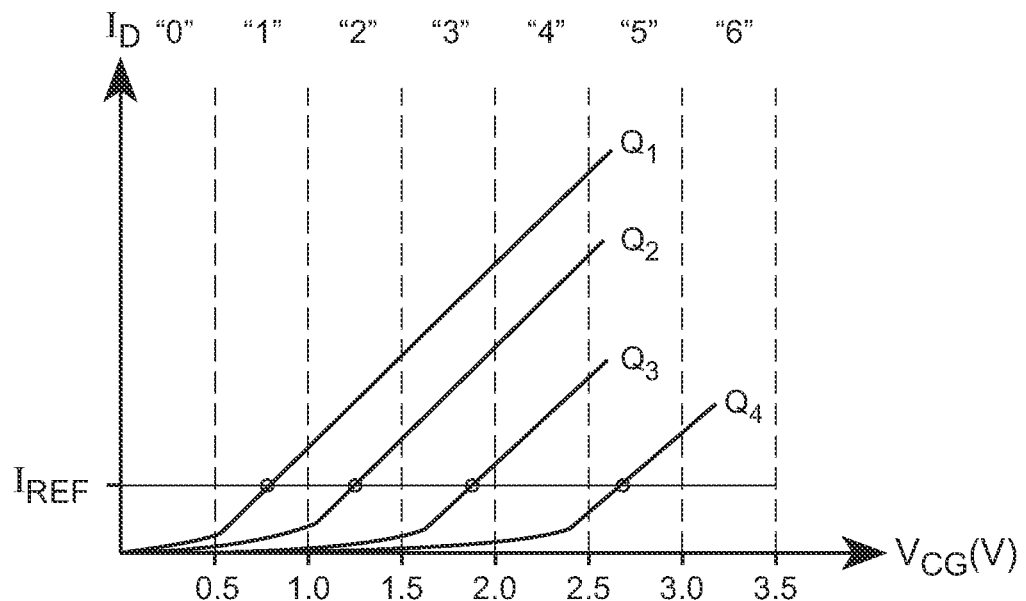
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
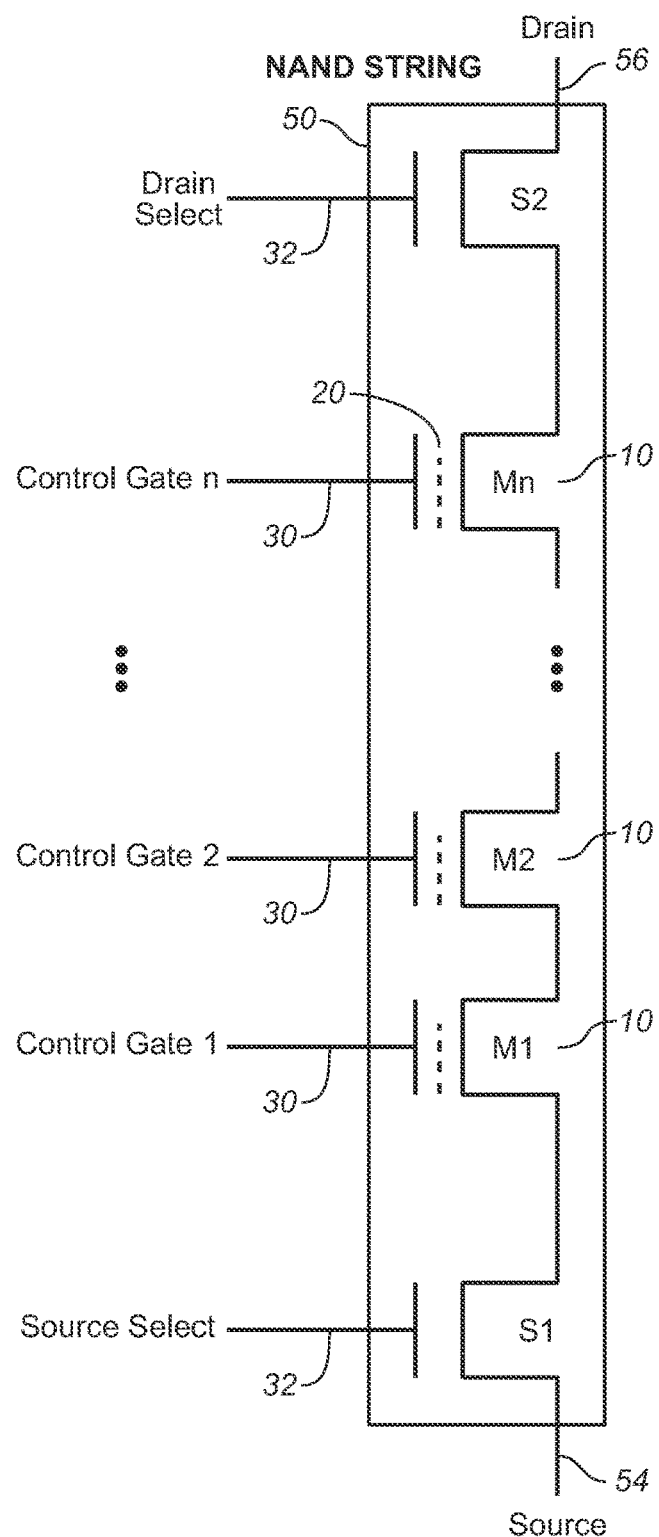
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

FIG. 4B illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
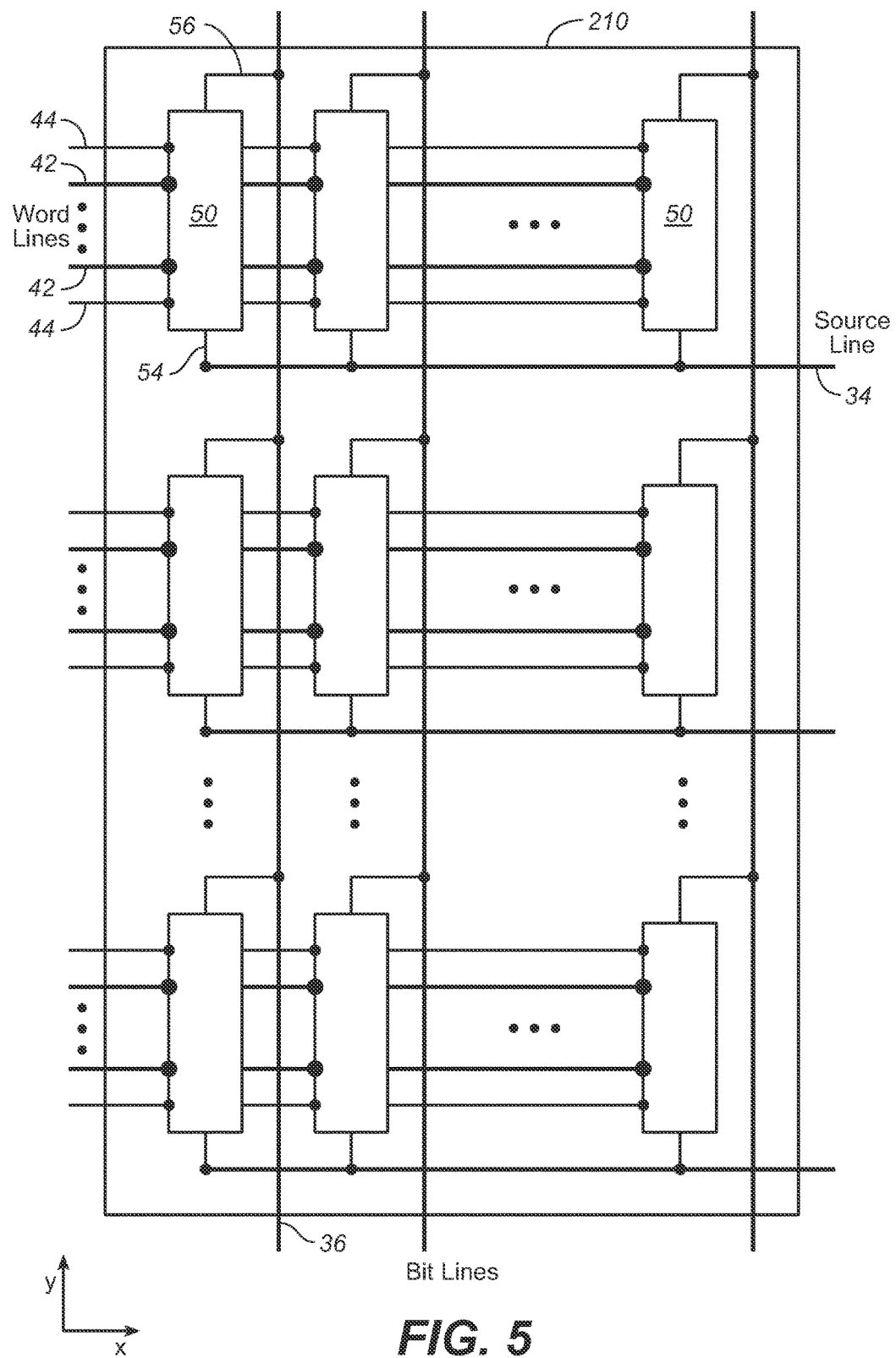
FIG. 5 illustrates an example of a NAND array 210 of memory cells, constituted from NAND strings 50 such as that shown in FIG. 4.
Figure 6:
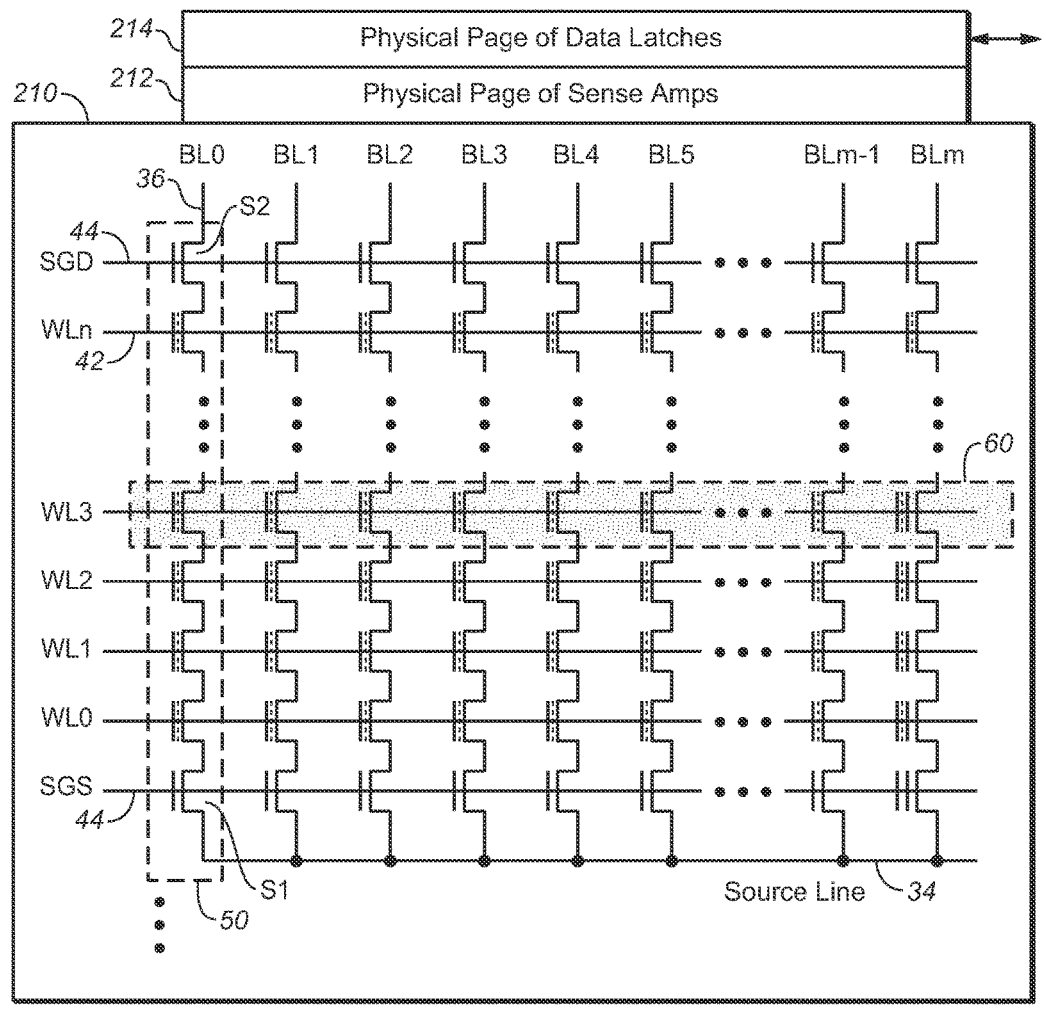
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7A:
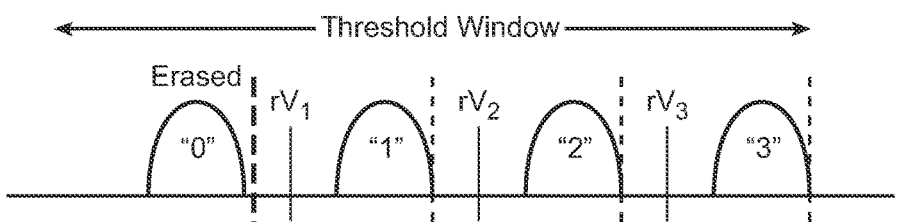
FIGS. 7A-7C illustrate an example of programming a population of memory cells.
Figure 7B:
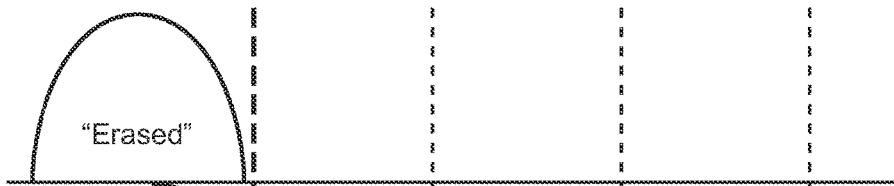
Figure 7C:
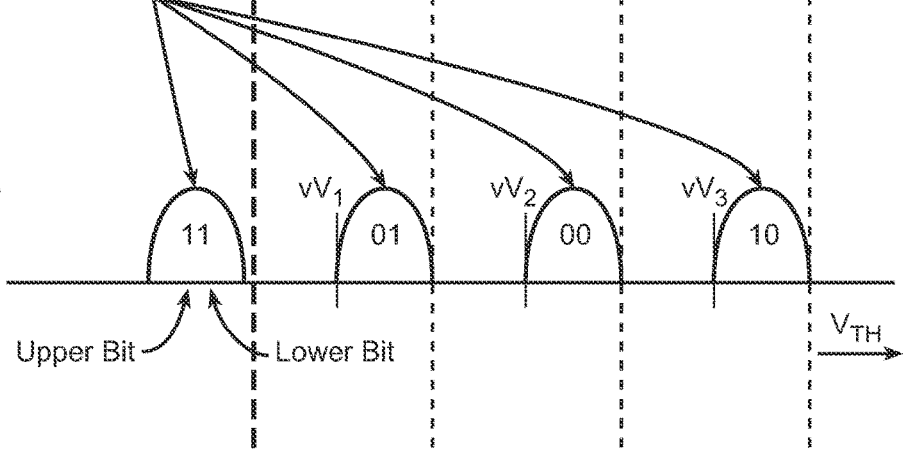

FIGS. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence"

mode where the two bits are sensed together by sensing relative to the read demarcation threshold values $rV_1$, $rV_2$ and $rV_3$ in three sub-passes respectively.

Bit-by-Bit MLC Programming and Reading

Figure 7D:
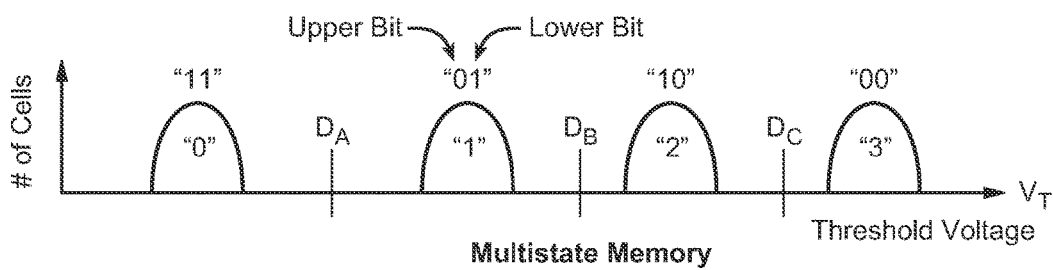
FIGS. 7D-7H illustrate the programming and reading of the 4-state memory encoded with a given 2-bit code.

FIGS. 7D-7H illustrate the programming and reading of the 4-state memory encoded with a given 2-bit code. FIG. 7D illustrates threshold voltage distributions of the 4-state memory array when each memory cell stores two bits of data using the 2-bit code.

Figure 7E:
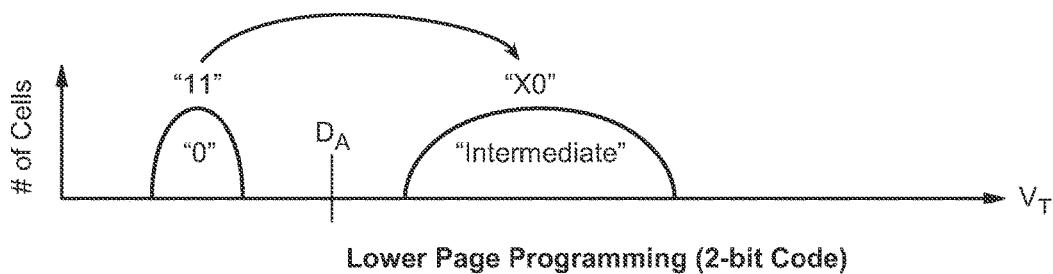

FIG. 7E illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7F:
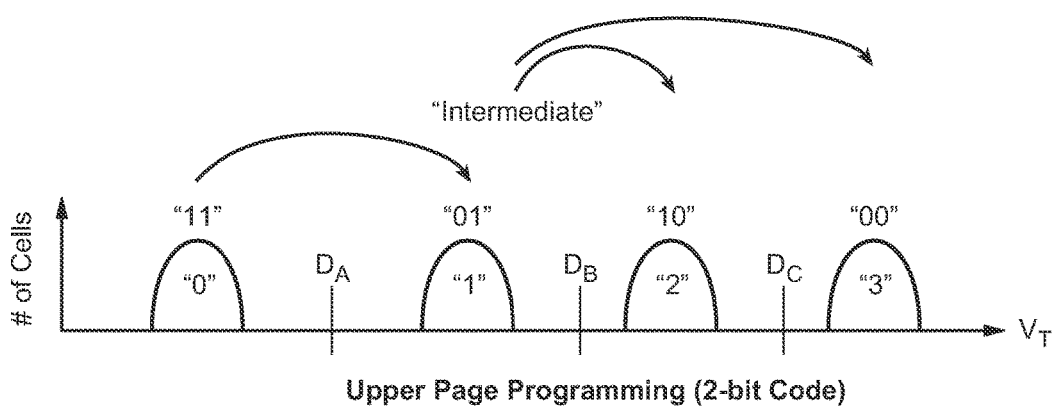

FIG. 7F illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7G:
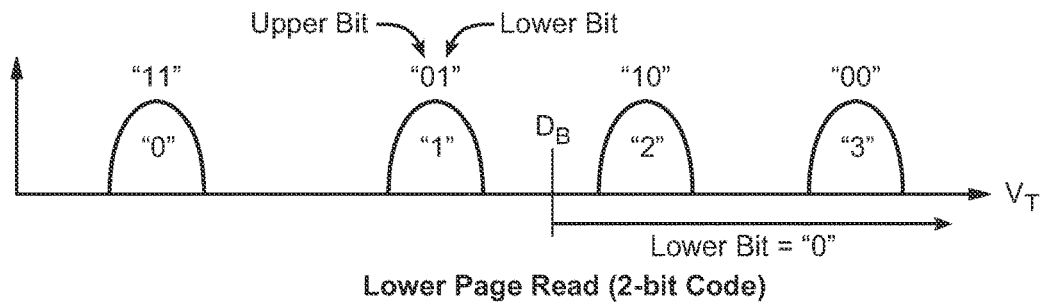

FIG. 7G illustrates the read operation that is required to discern the lower bit of the 4-state memory encoded with the 2-bit code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 7H:
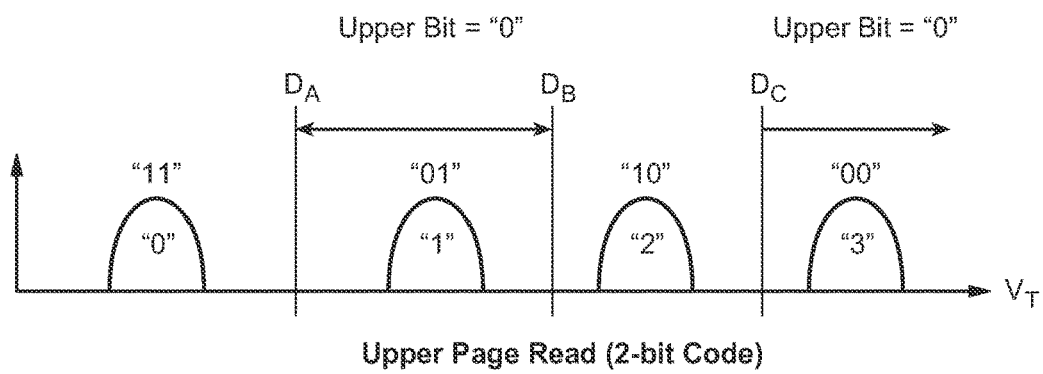

FIG. 7H illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit.

Foggy-Fine Programming

Figure 7I:
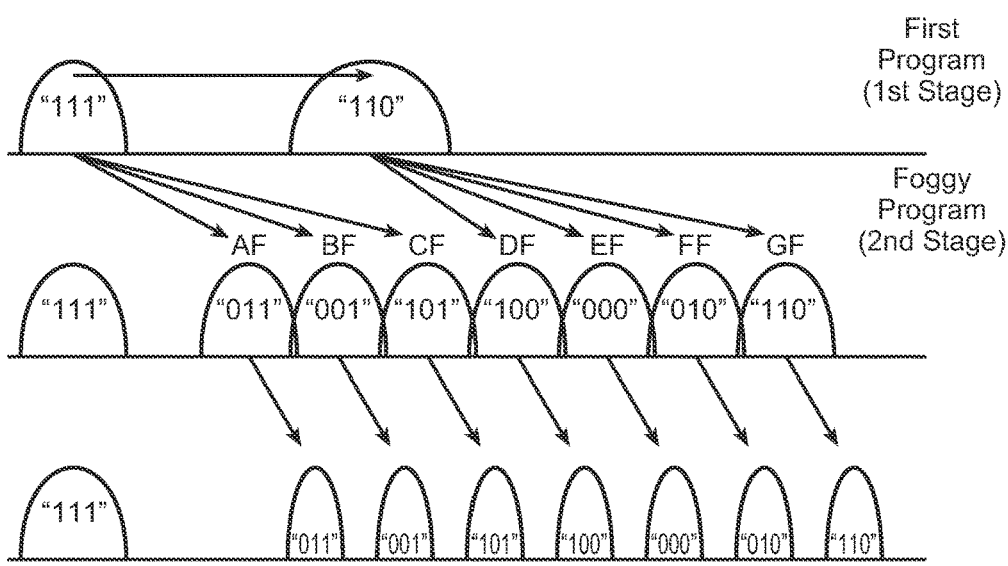
FIG. 7I illustrates a foggy-fine programming for an 8-state memory encoded with a given 3-bit code.

Another variation on multi-state programming employs a foggy-fine algorithm, as is illustrated in FIG. 7I for a 3-bit memory example. As shown there, this another multi-phase programming operation. A first programming operation is performed as shown in the top line, followed the foggy programming stage. The foggy phase is a full 3-bit programming operation from the first phase using all eight of the final states. At the end of the foggy, though, the data in these states is not yet fully resolved into well defined distributions for each of the 8 states (hence, the "foggy" name) and is not readily extractable.

As each cell is, however, programmed to near its eventual target state, the sort of neighboring cell to cell couplings, or "Yupin" effect, described in U.S. Pat. No. 6,870,768 are presenting most of their effect. Because of this, when the fine program phase (shown on the bottom line) is executed, these couplings have largely been factored in to this final phase so the cell distributions are more accurately resolved to their target ranges.

Binary and MLC Memory Partitioning

FIG. 6 and FIGS. 7A-I illustrate examples of a 2-bit (also referred to as "D2") memory. As can be seen, a D2 memory has its threshold range or window partitioned into 4 regions, designating 4 states. Similarly, in D3, each cell stores 3 bits (low, middle and upper bits) and there are 8 regions. In D4, there are 4 bits and 16 regions, etc. As the memory's finite threshold window is partitioned into more regions, the resolution and for programming and reading will necessarily become finer. Two issues arise as the memory cell is configured to store more bits.

First, programming or reading will be slower when the threshold of a cell must be more accurately programmed or read. In fact in practice the sensing time (needed in programming and reading) tends to increase as the square of the number of partitioning levels.

Secondly, flash memory has an endurance problem as it ages with use. When a cell is repeatedly programmed and erased, charges is shuttled in and out of the floating gate 20 (see FIG. 2) by tunneling across a dielectric. Each time some charges may become trapped in the dielectric and will modify the threshold of the cell. In fact over use, the threshold window will progressively narrow. Thus, MLC memory generally is designed with tradeoffs between capacity, performance and reliability.

Conversely, it will be seen for a binary memory, the memory's threshold window is only partitioned into two regions. This will allow a maximum margin of errors. Thus, binary partitioning while diminished in storage capacity will provide maximum performance and reliability.

The multi-pass, bit-by-bit programming and reading technique described in connection with FIGS. 7A-I provides a smooth transition between MLC and binary partitioning. In this case, if the memory is programmed with only the lower bit, it is effectively a binary partitioned memory. While this approach does not fully optimize the range of the threshold window as in the case of a single-level cell ("SLC") memory, it has the advantage of using the same demarcation or sensing level as in the operations of the lower bit of the MLC memory. As will be described later, this approach allows a MLC memory to be "expropriated" for use as a binary memory, or vice versa. How it should be understood that MLC memory tends to have more stringent specification for usage.

Binary Memory and Partial Page Programming

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Bit-by-Bit MLC Programming technique described in connection with FIGS. 7A-C above is designed to minimize program disturb from cells along the same word line. As can be seen from FIG. 7D, in a first of the two programming passes, the thresholds of the cells are moved at most half way up the threshold window. The effect of the first pass is overtaken by the final pass. In the final pass, the thresholds are only moved a quarter of the way. In other words, for D2, the charge difference among neighboring cells is limited to a quarter of its maximum. For D3, with three passes, the final pass will limit the charge difference to one-eighth of its maximum.

However, the bit-by-bit multi-pass programming technique will be compromised by partial-page programming. A page is a group of memory cells, typically along a row or word line, that is programmed together as a unit. It is possible to program non overlapping portions of a page individually over multiple programming passes. However, owning to not all the cells of the page are programmed in a final pass together, it could create large difference in charges programmed among the cells after the page is done. Thus partial-page programming would result in more program disturb and would require a larger margin for sensing accuracy.

In the case the memory is configured as binary memory, the margin of operation is wider than that of MLC. In the preferred embodiment, the binary memory is configured to support partial-page programming in which non-overlapping portions of a page may be programmed individually in one of the multiple programming passes on the page. The programming and reading performance can be improved by operating with a page of large size. However, when the page size is much larger than the host's unit of write (typically a 512-byte sector), its usage will be inefficient. Operating with finer granularity than a page allows more efficient usage of such a page.

The example given has been between binary versus MLC. It should be understood that in general the same principles apply between a first memory with a first number of levels and a second memory with a second number of levels more than the first memory.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
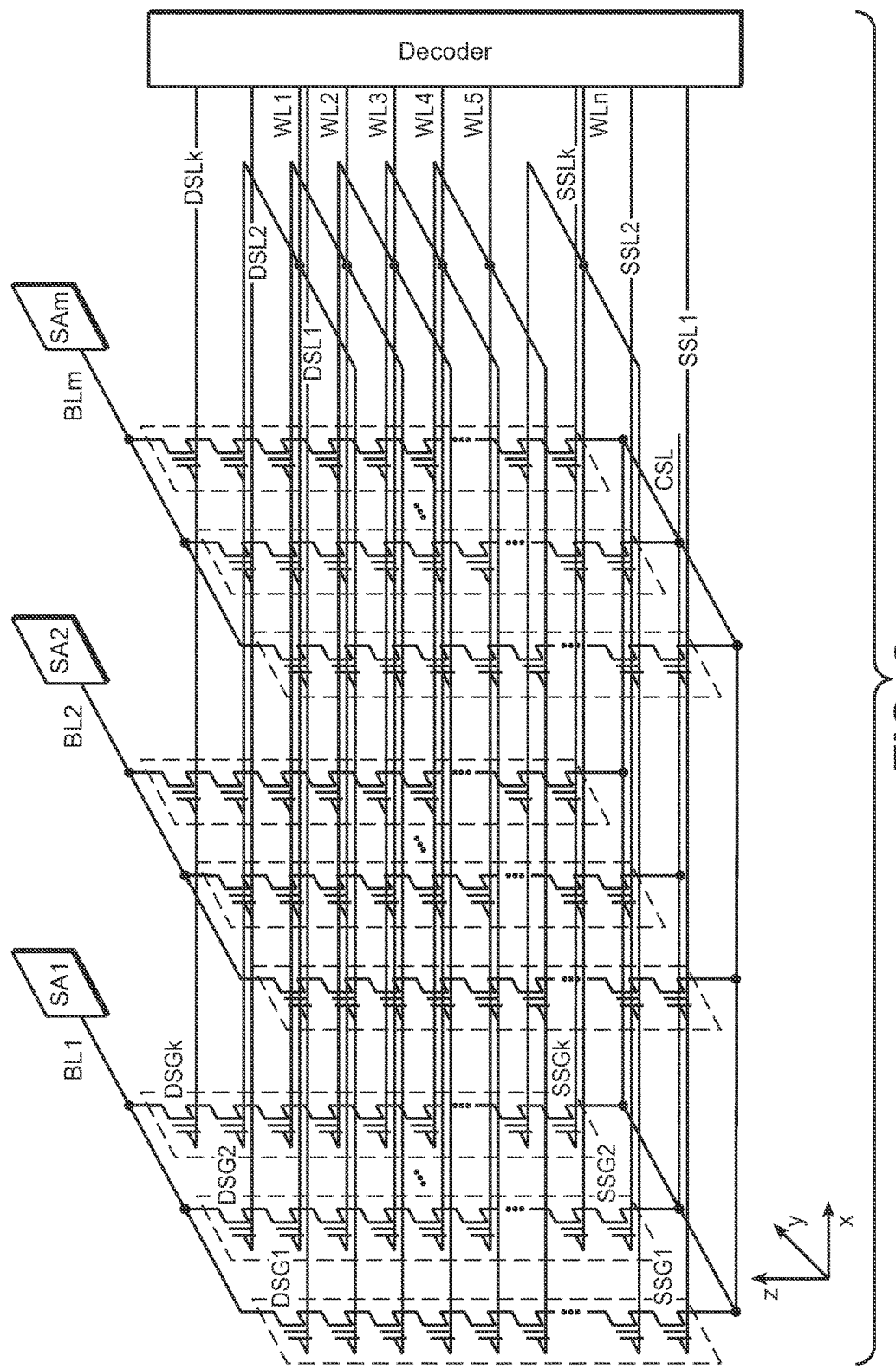
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-$m$, each run across the top to an associated sense amp SA1-$m$. The word lines, WL1-$n$, and source and select lines SSL1-$n$ and DSL1-$n$, then run in x direction, with the NAND string connected at bottom to a common source line CSL.

Figure 9:
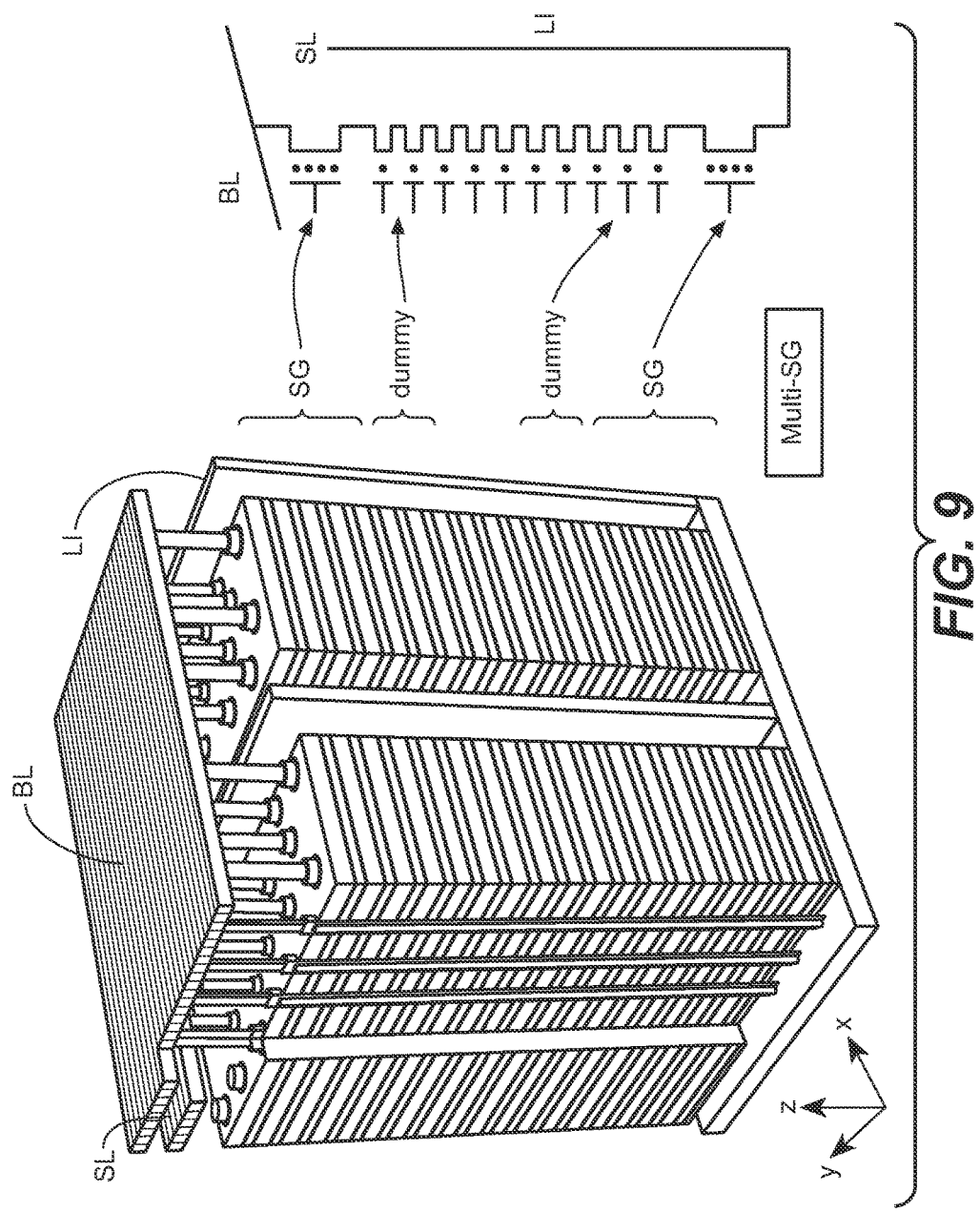
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series, making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
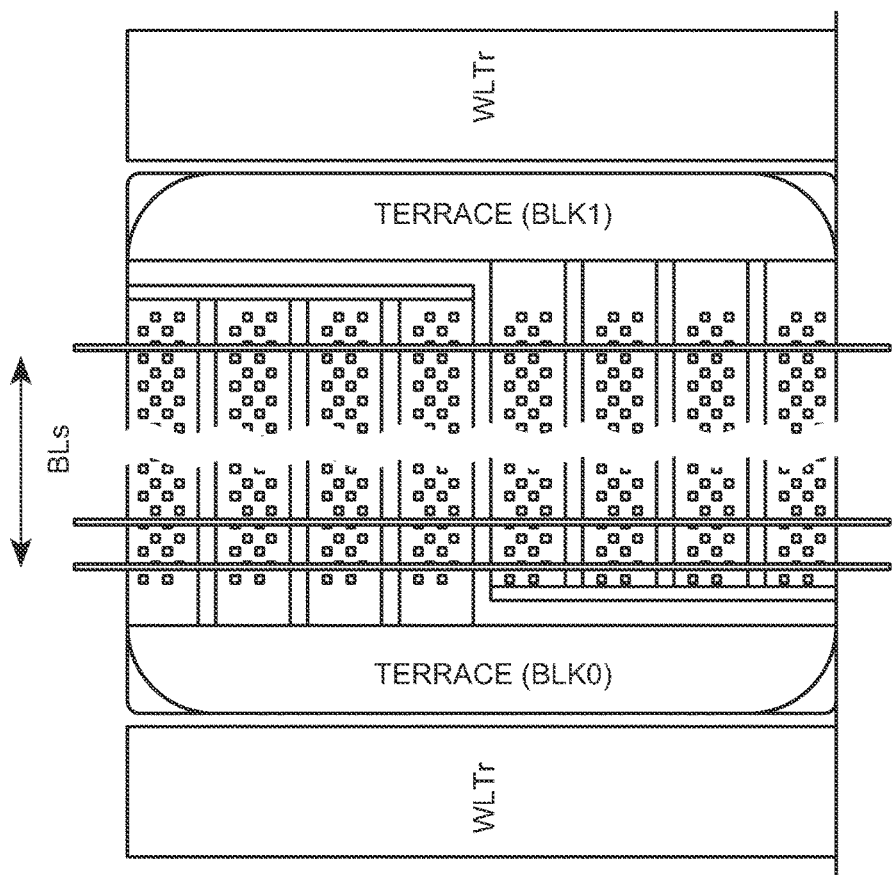

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multi-plexed to several bit lines.

Figure 11:
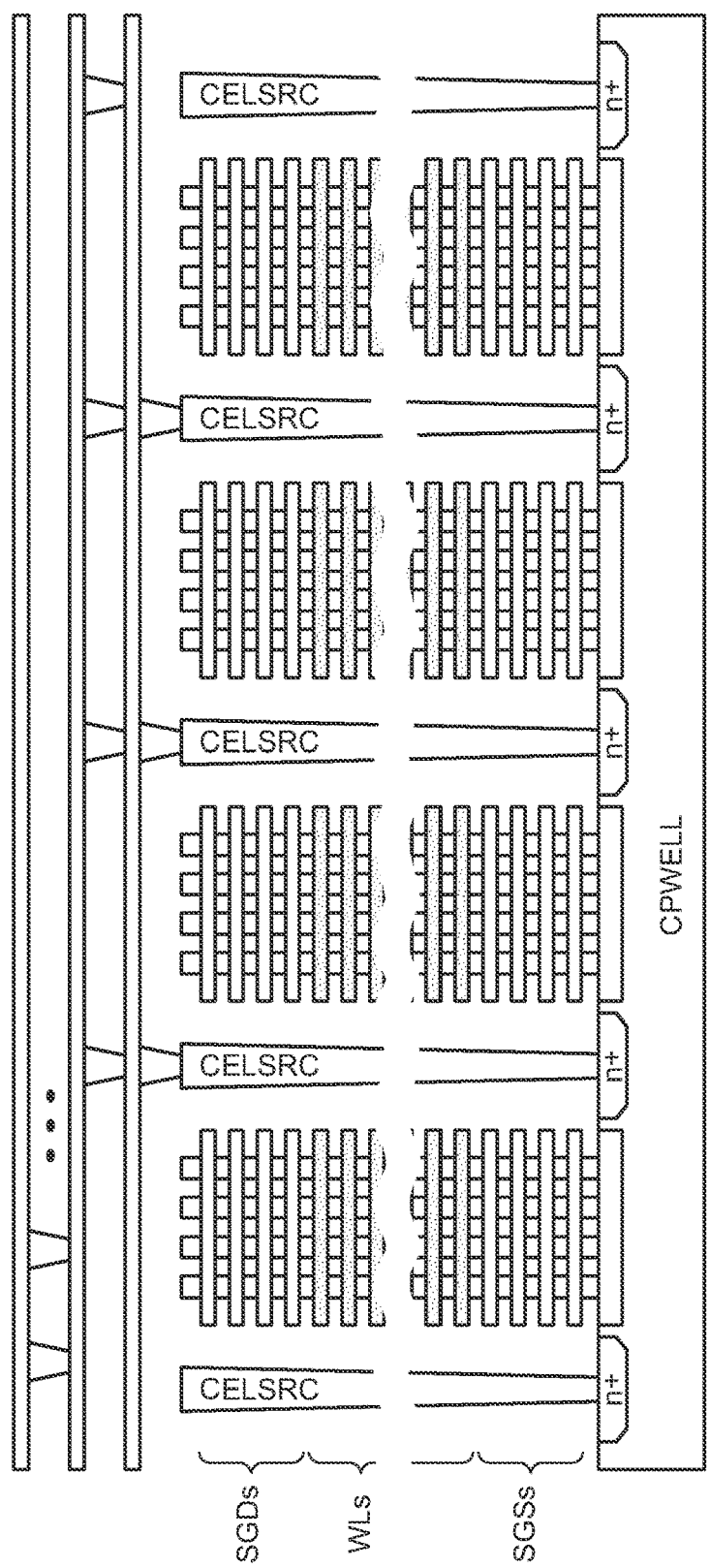

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
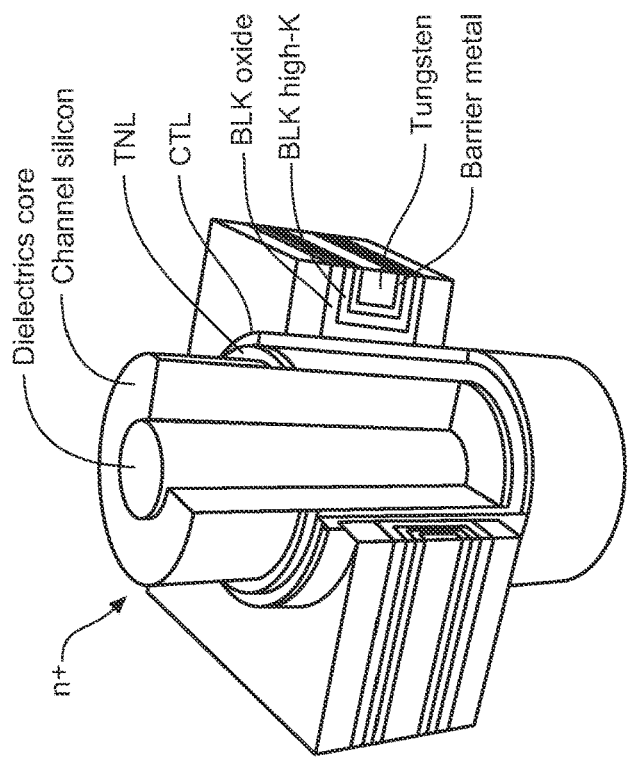

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Logical and Physical Block Structures

Figure 13:
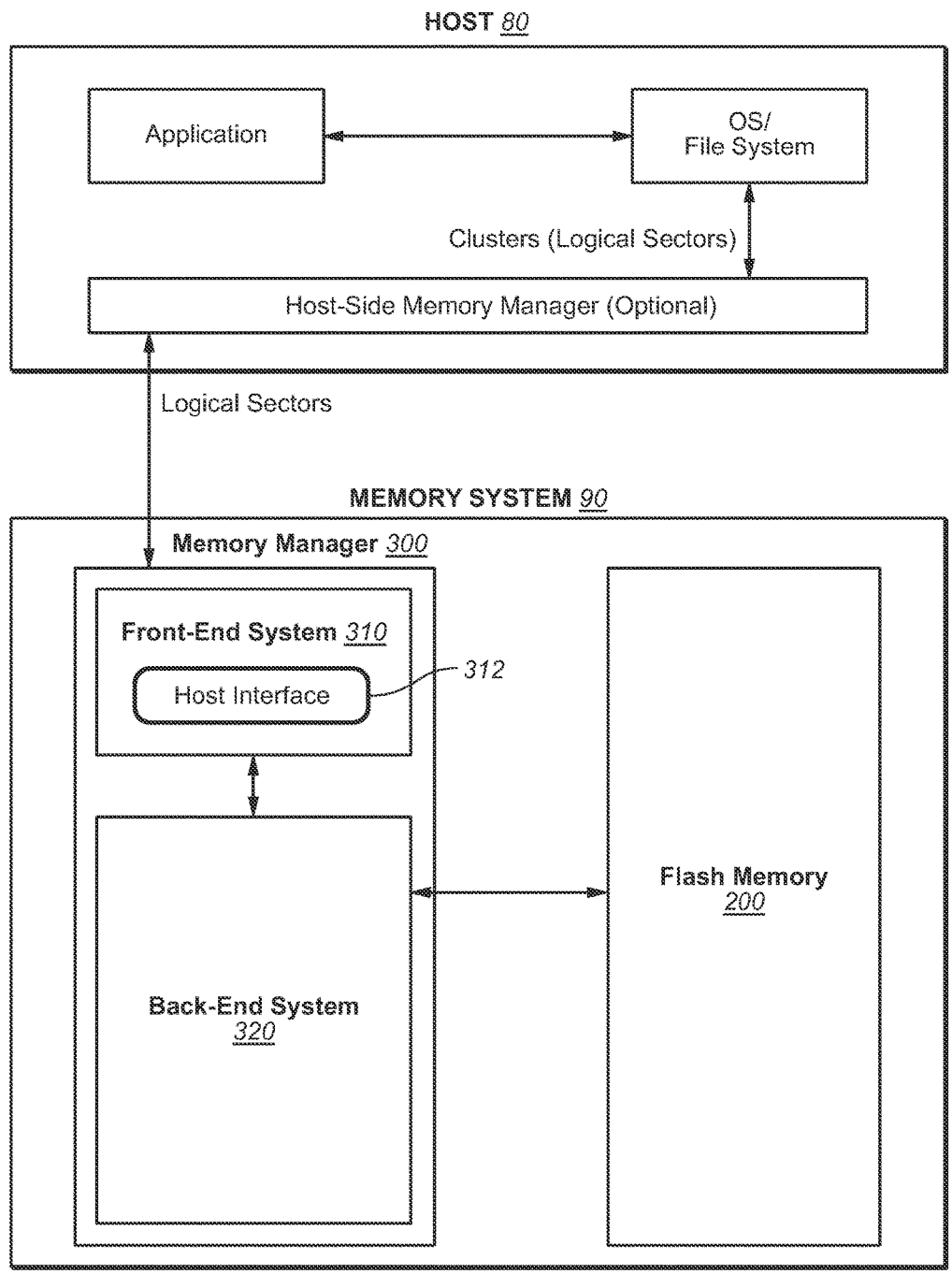
FIG. 13 illustrates the memory being managed by a memory manager which is a software component that resides in the controller.

FIG. 13 illustrates the memory being managed by a memory manager which is a software component that resides in the controller. The memory 200 is organized into blocks, each block of cells being a minimum unit of erase. Depending on implementation, the memory system may operate with even large units of erase formed by an aggregate of blocks into "metablocks" and also "megablocks". For convenience the description will refer to a unit of erase as a metablock although it will be understood that some systems operate with even larger unit of erase such as a "megablock" formed by an aggregate of metablocks.

The host 80 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 80 essentially issues a command to the memory system 90 to read or write a segment containing a string of logical sectors of data with contiguous addresses.

A memory-side memory manager 300 is implemented in the controller 100 of the memory system 90 to manage the storage and retrieval of the data of host logical sectors among metablocks of the flash memory 200. The memory manager comprises a front-end system 310 and a back-end system 320. The front-end system 310 includes a host interface 312. The back-end system 320 includes a number of software modules for managing erase, read and write operations of the metablocks. The memory manager also maintains system control data and directory data associated with its operations among the flash memory 200 and the controller RAM 130.

Figure 14:
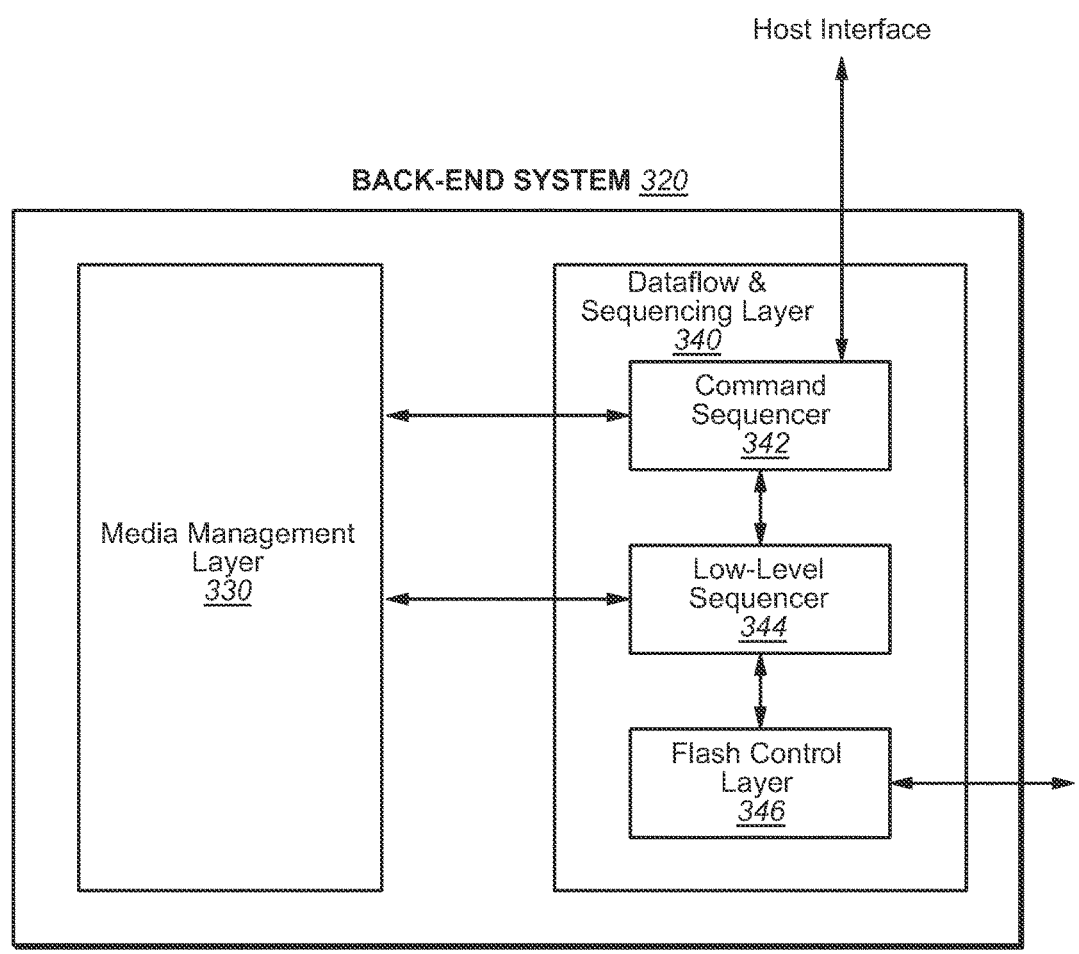
FIG. 14 illustrates the software modules of the back-end system.

FIG. 14 illustrates the software modules of the back-end system. The Back-End System mainly comprises two functional modules: a Media Management Layer 330 and a Dataflow and Sequencing Layer 340.

The dataflow and sequencing layer 340 is responsible for the sequencing and transfer of sectors of data between a front-end system and a flash memory. This layer includes a command sequencer 342, a low-level sequencer 344 and a flash Control layer 346.

The memory manager 300 is preferably implemented in the controller 100. It translates logical addresses received from the host into physical addresses within the memory array, where the data are actually stored, and then keeps track of these address translations.

Figure 15A:
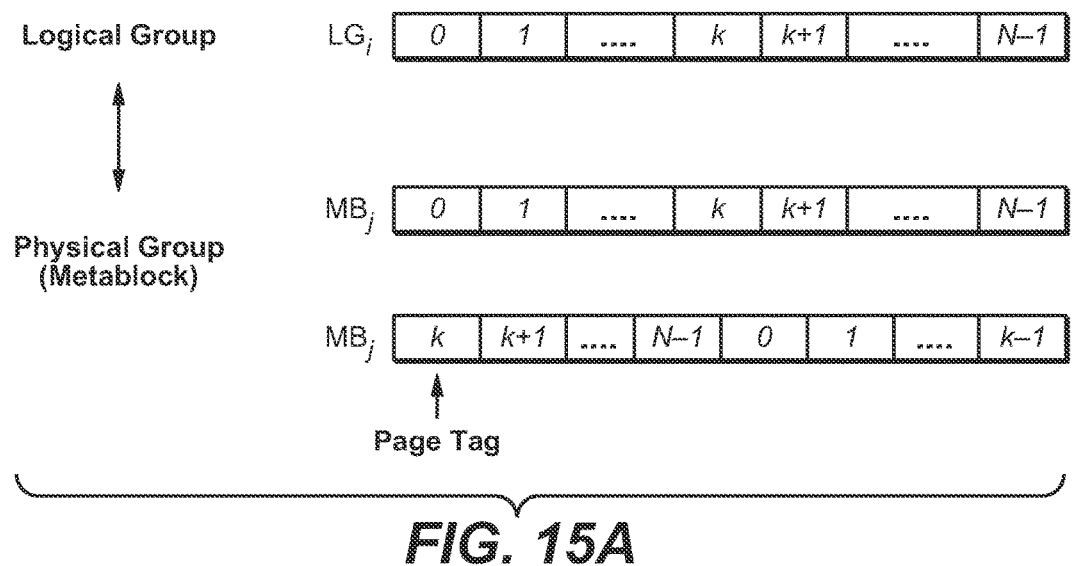
FIG. 15A illustrates schematically the mapping between a logical group and a metablock.

FIG. 15A illustrates schematically the mapping between a logical group and a metablock. The metablock of the physical memory has N physical sectors for storing N logical sectors of data of a logical group. FIG. 15A at the top row shows the data from a logical group $LG_i$, where the logical sectors are in contiguous logical order 0, 1, . . . , N−1. In the center row FIG. 15A shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 15A bottom row, the metablock stores in its first location beginning with the data of logical sector k. When the last logical sector N−1 is reached, it wraps around to sector 0 and finally storing data associated with logical sector k−1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 15B:
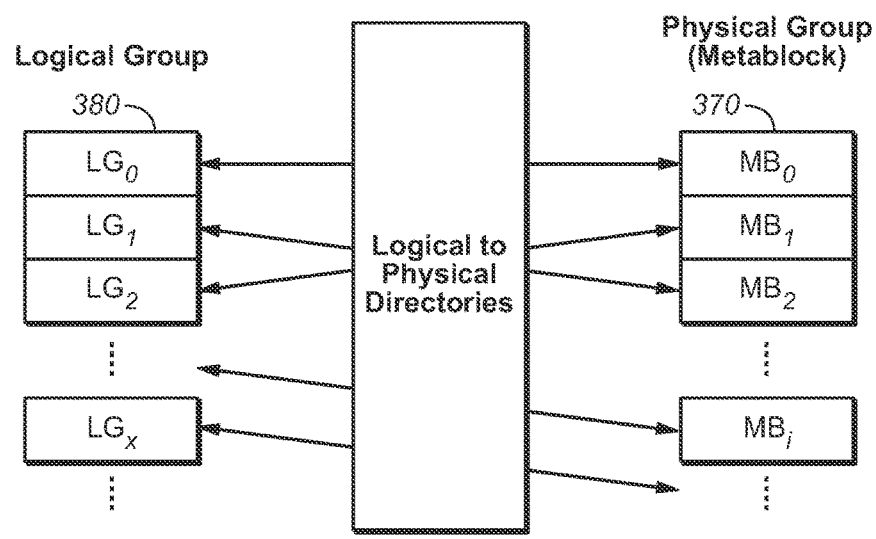
FIG. 15B illustrates schematically the mapping between logical groups and metablocks.

FIG. 15B illustrates schematically the mapping between logical groups and metablocks. Each logical group 380 is mapped to a unique metablock 370, except for a small number of logical groups in which data is currently being updated. After a logical group has been updated, it may be mapped to a different metablock. The mapping information is maintained in a set of logical to physical directories, which will be described in more detail later.

Memories Having Multi-Level and Binary Portions

Memory Partitioned into Main and Binary Cache Portions

A number of memory system arrangements where the non-volatile memory includes both binary and multi-level sections will now be described. In a first of these, in a flash memory having an array of memory cells that are organized into a plurality of blocks, the cells in each block being erased together, the flash memory is partitioned into at least two portions. A first portion forms the main memory for storing mainly user data. Individual memory cells in the main memory being configured to store one or more bits of data in each cell. A second portion forms a cache for data to be written to the main memory. The memory cells in the cache portion are configured to store less bits of data in each cell than that of the main memory. Both the cache portion and the main memory portion operate under a block management system for which cache operation is optimized.

In the preferred embodiment, individual cells in the cache portion are each configured to store one bit of data while the cells in the main memory portion each stores more than one bit of data. The cache portion then operates as a binary cache with faster and more robust write and read performances.

In the preferred embodiment, the cache portion is configured to allow finer granularity of writes than that for the main memory portion. The finer granularity is more compatible with the granularity of logical data units from a host write. Due to requirement to store sequentially the logical data units in the blocks of the main memory, smaller and chaotic fragments of logical units from a series of host writes can be buffered in the cache portion and later reassembly in sequential order to the blocks in the main memory portion.

In one aspect of the invention, the decision for the block management system to write data directly to the main portion or to the cache portion depends on a number of predefined conditions. The predefined conditions include the attributes and characteristics of the data to be written, the state of the blocks in the main memory portion and the state of the blocks in the cache portion.

The Binary Cache of the present system has the follows features and advantages: a) it increases burst write speed to the device; b) it allows data that is not aligned to pages or meta-pages to be efficiently written; c) it accumulates data for a logical group, to minimize the amount of data that must be relocated during garbage collection of a meta-block after the data has been archived to the meta-block; d) it stores data for a logical group in which frequent repeated writes occur, to avoid writing data for this logical group to the meta-block; and e) it buffers host data, to allow garbage collection of the meta-block to be distributed amongst multiple host busy periods.

Figure 16:
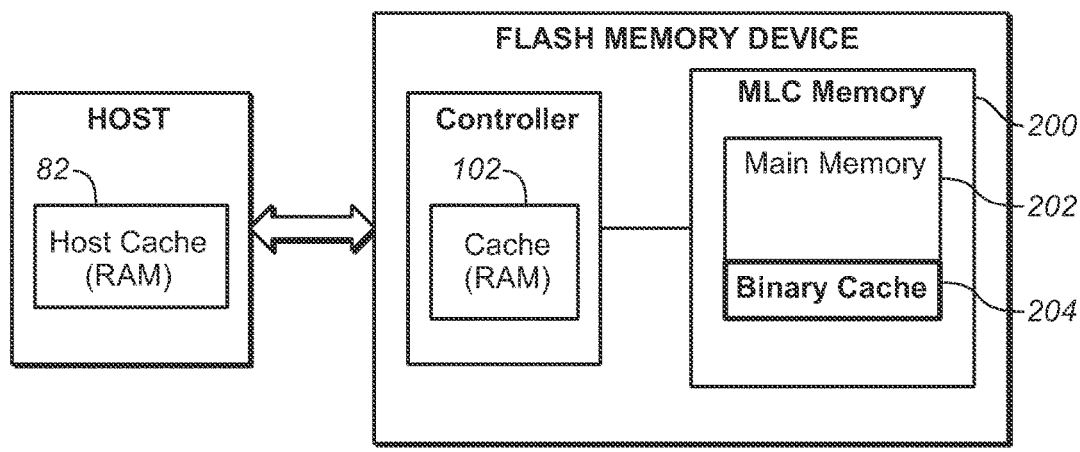
FIG. 16 illustrates a host operating with the flash memory device through a series of caches at different levels of the system.

FIG. 16 illustrates a host operating with the flash memory device through a series of caches at different levels of the system. A Cache is high-speed storage for temporarily storing data being passed between a high-speed and a slower-speed component of the system. Typically high-speed volatile RAM are employed as cache as in a host cache 82 and/or in a controller cache 102 of the memory controller. The non-volatile memory 200 is partitioned into two portions. The first portion 202 has the memory cells operating as a main memory for user data in either MLC or binary mode. The second portion 204 has the memory cells operating as a cache in a binary mode. Thus, the memory 200 is partitioned into a main memory 202 and a binary cache.

On-Memory Folding of Data into Multi-State Format

The various sorts of non-volatile memories described above can be operated in both binary forms and multi-state (or multi-level) forms. Some memory systems store data in both binary and multi-state formats; for example, as data can typically be written more quickly and with less critical tolerances in binary form, a memory may initial write data in binary form as it is received from a host and later rewrite this data in a multi-state format for greater storage density. In such memories, some cells may be used in binary format with others used in multi-state format, or the same cells may be operated to store differing numbers of bits. The techniques described in this section relate to rewriting data from a binary format into a multi-state format in a "folding" process executed on the memory device itself, without the requirement of transferring the data back to the controller for reformatting. The on-memory folding process can also be used in a special way to manage error correction code (ECC) where the relative state of the data in the memory cell, when stored in multi-state form, is taken into account when considering that the most probable errors are transitions between the neighboring states (so called "Strong ECC" or "SECC"). The system can also use ECC management which does not consider state information and manages ECC based on single page information.

More specifically, in one exemplary embodiment, as data is transferred from the controller to the memory, it is written along word lines of the memory array in a binary format. Subsequently, the data is then read into the registers associated with the array, where it is rearranged so that it can be written back into array in a multi-state form. To take the case of three bits per cell, for example, the content of three word lines would be each be read into the register structures, rearranged to correspond to the three bits that would be stored in each cell, and then rewritten back to a single word line of the array in a 3-bit per cell format. In the arrangement described here, the binary data content of a single word line is then end up on 1/Nth of a word line store in an N-bit per cell format. For cases where the eventual N-bit storage of the data uses an error correction code (ECC) that exploits the relation of the multi-states with a cell, this ECC can be determined in the controller and transferred along with the corresponding data and stored in the binary format prior to the data (and corresponding ECC) being rewritten in the multi-state format.

Figure 17:
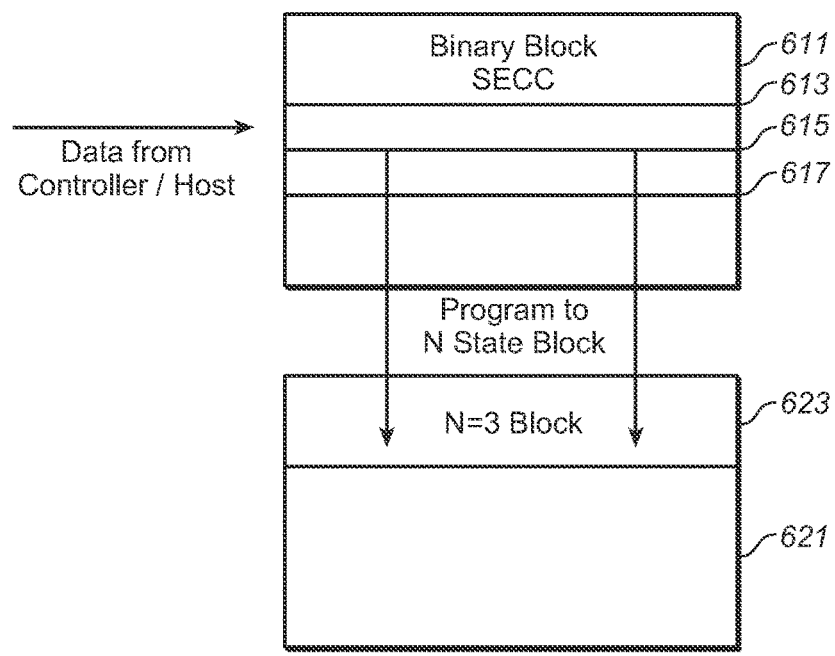
FIG. 17 outlines the on-memory folding process where the data from multiple word lines written in a binary format are rewritten into a multi-state format.

The idea of folding data from a binary to a multi-state, or MLC, format can be illustrated with FIG. 17 for one particular 3-bit per cell example. As shown by the arrow, data is received from the controller (or host) and written in binary format in a block 611 of the memory. Three of the written word lines (613, 615, 617) of the block 611 are explicitly shown. The content of these three word lines are then rewritten in a 3-bit per cell format along the single word line 623 of block 621, with the "folding" process accomplished on the memory itself (More generally, if the data is written along 621 in an N-bit per cell format, the content of N-word lines of binary content would be folded up in this manner. This block 611 may specifically assigned to be operated in only binary mode or may be a block operable in a MLC mode by, for example, just the lowest page of multiple logical pages storable on a physical page. Similarly, block 621 may be assigned only for multi-state operation or may be operable in binary mode as well.

Figure 18:
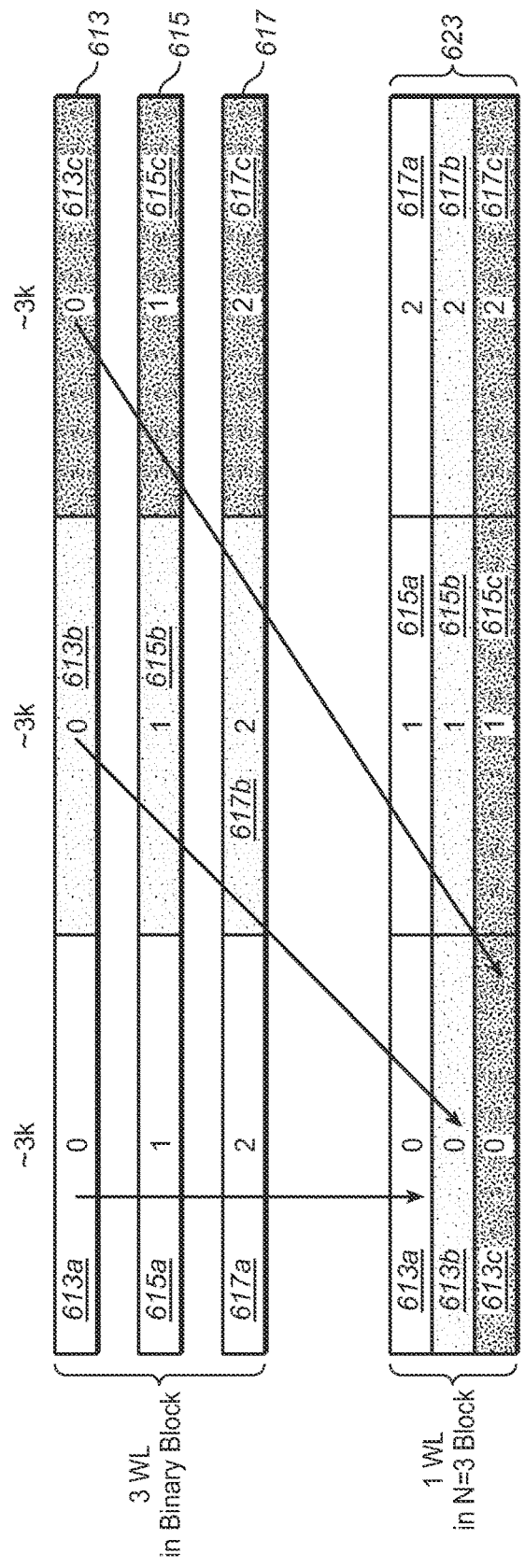
FIG. 18 illustrates aspects of the folding process in more detail.

Some detail on how one exemplary embodiment folds the data from the multiple binary format word lines into a single word line is shown in FIG. 18. At the top of FIG. 18 are the three word lines 613, 615, and 617, which are each split into three parts (a, b, c) of a third of the cells along a corresponding third of the bit lines (here taken as contiguous). On word line 623, the three thirds of the first word line (613a-c) are arranged onto to first third of the of the word line; similarly, the second binary word line 615 is folded and written into the middle third of 623 and the third word line from the binary block 617 is written into the last third of 623.

The process shown in FIG. 18 generalizes in a number of ways. A first of these is in the number of states stored per cell in the multi-state format. Although FIGS. 17 and 18 show the case where three pages of data are rewritten from three physical pages into multi-state format on a single physical page, other numbers of storage densities can be used. (For example, to simplify the following discussion, particularly that related to the register structure, the 2-bit per cell case will often be used as the exemplary embodiment.) Also, although full word lines (each here corresponding to a page) are shown, in system that allow partial page operation, partial pages may be used. Additionally, although FIG. 18 shows the case where cells along the word line are split into groups along contiguous bit lines for folding, other arrangements can be used. In the following sections, "folding" will generally refer to the sort of process where data is read from several locations in the binary section into the data read/write registers and then re-written into multi-state form in the MLC memory section, most easily visualized for the example of reading out N binary word lines and re-writing them on a single word line in N-bit per cell format; and although the folding can involve the sort of on-chip transpositions illustrated with respect to FIG. 18, more generally it may also be the more straight forward direct copy type of folding.

As noted above, the folding process is performed on the memory itself, so that once the data is transferred in from the controller (or host) and written in binary format, it is rewritten into the array without transferring it off the memory. The exemplary embodiments accomplish this by reading the data of the multiple binary word lines (e.g., 613, 615, 617) into the corresponding registers (or latches) associated with the array, rearranged within these registers into the form needed for multi-state programming, and then rewritten into a single word line (e.g., 623) of a multi-state block. Thus, under the arrangement of FIG. 18, the binary content of several (here 3) cells on the same word line, but along different bit lines, are read into the associated data registers, and then rearranged to correspond to the multi-bits of a single cell on a corresponding single bit line, from where it can be written.

Although this folding has here been described as folding N logical pages of data from N physical pages of binary memory to one physical page of N-bit per cell memory. (Here, the physical page is taken as a whole word line.) More generally, the logical data can be scattered in any fashion between physical pages. In this sense, it is not a direct 3-page to single page mapping, but is more of a mapping with 3-to-1 ratio.

Binary/Multi-State Memory Using Folding

Figure 19:
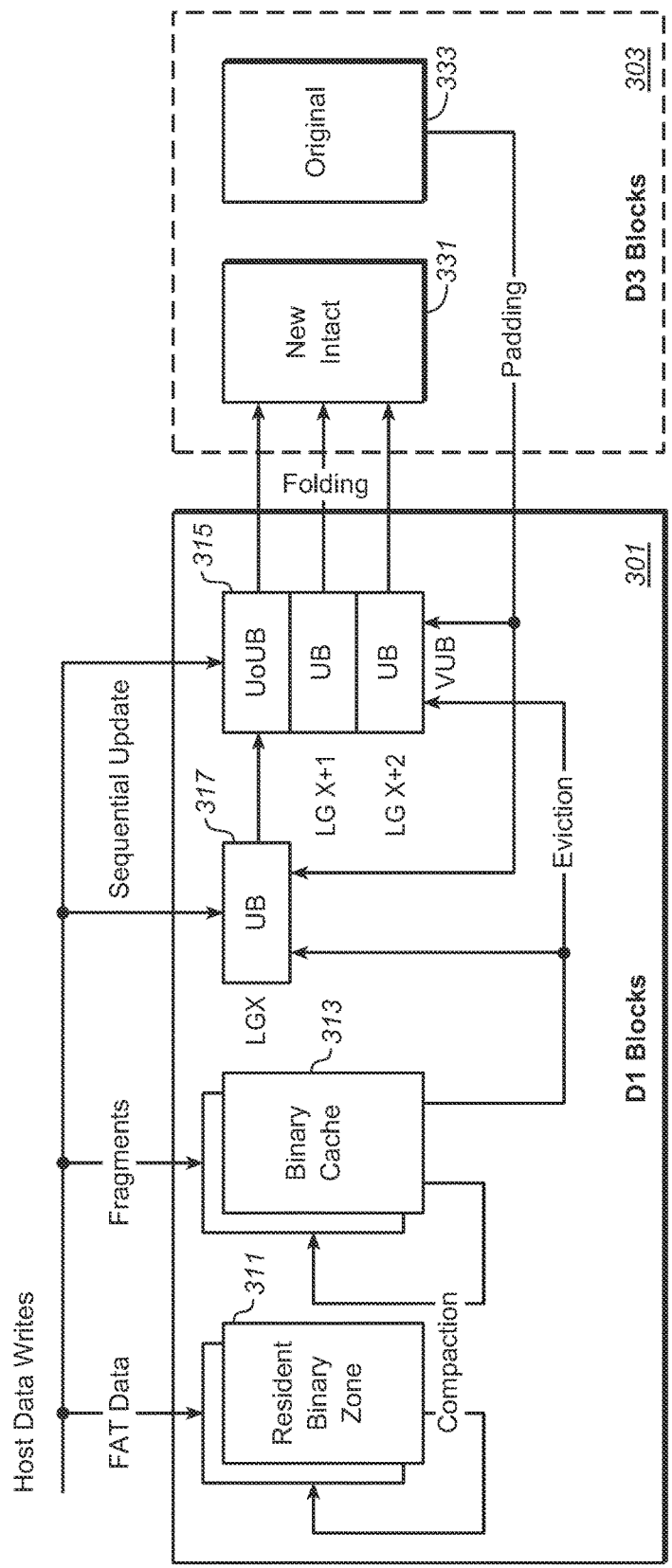
FIG. 19 shows another example of a non-volatile memory that includes both binary and multi-state memory portions.

FIG. 19 shows another example of a non-volatile memory that includes both binary and multi-state memory portions. The binary part of the memory, D1 blocks 301, includes both control data, such as file access tables (FAT), in the resident binary zone 311 and a binary cache area 313. For this discussion, these areas can be taken to be similar to those described above in the Binary Cache section above and the references cited therein. These areas are updated and compacted within themselves and do not enter further into this section. The memory also includes the multi-state (3-bit in this example) memory portion of D3 blocks 303. The D1 and D3 blocks 301 and 303 can be distributes across various semi-autonomous arrays (i.e., dies or planes within a die). (More generally, the distinction between where the updates may be stored in memory and the "bulk" storage need not be based on, or at least not characterized in terms of, binary versus multi-level, but could also be slow versus fast, relatively high endurance versus lower endurance, small block structure versus large block, or other qualitative property.)

In the exemplary embodiment, data is first written to the binary block 301 and then folded into D3 blocks. For example, once three 3 pages are written into the binary memory, then can then be folded into a single page in D3 memory 303 or follow the sort of diagonal lower-foggy-fine programming method described in U.S. patent application Ser. No. 12/642,740, entitled "Non-volatile Memory and Method with Atomic Program Sequence and Write Abort Detection" by Gorobets et al. which was filed on Dec. 18, 2009 and issued as U.S. Pat. No. 8,054,684 on Nov. 8, 2011. In the on-chip folding embodiment, the binary and MLC portions will be from different blocks formed along the same bit lines. More generally, other rewrite techniques can be used. Although in some embodiments data may written directly to multi-state memory, under this arrangement discussed here user data is first written from the volatile RAM into binary memory and then "triplets" (for the D3 example) of pages, such as in 315 for the logical groups X, X+1 and X+2, that are then combined and stored in a multi-state format as a "newly intact" physical page 331, where it is stored along with other such previously written "original" pages 333. When data of one of the pages stored in a D3 block is updated, rather than store the updated data in a D3 block, this can, at least initially, stored in a binary block Update Block, or UB, 317, as is described in the next section.

Block Management Scheme to Handle Cluster Failures

This section looks at a block management scheme that allows handling the cluster failures in in the selection of free blocks. Although applicable to both binary and multi-state blocks, and there corresponding free block lists, the following is discussed mainly in the context of the multi-state case, such for the 3-bit per cell write operation done as part of a folding operation as described above.

Figures 20, 21:
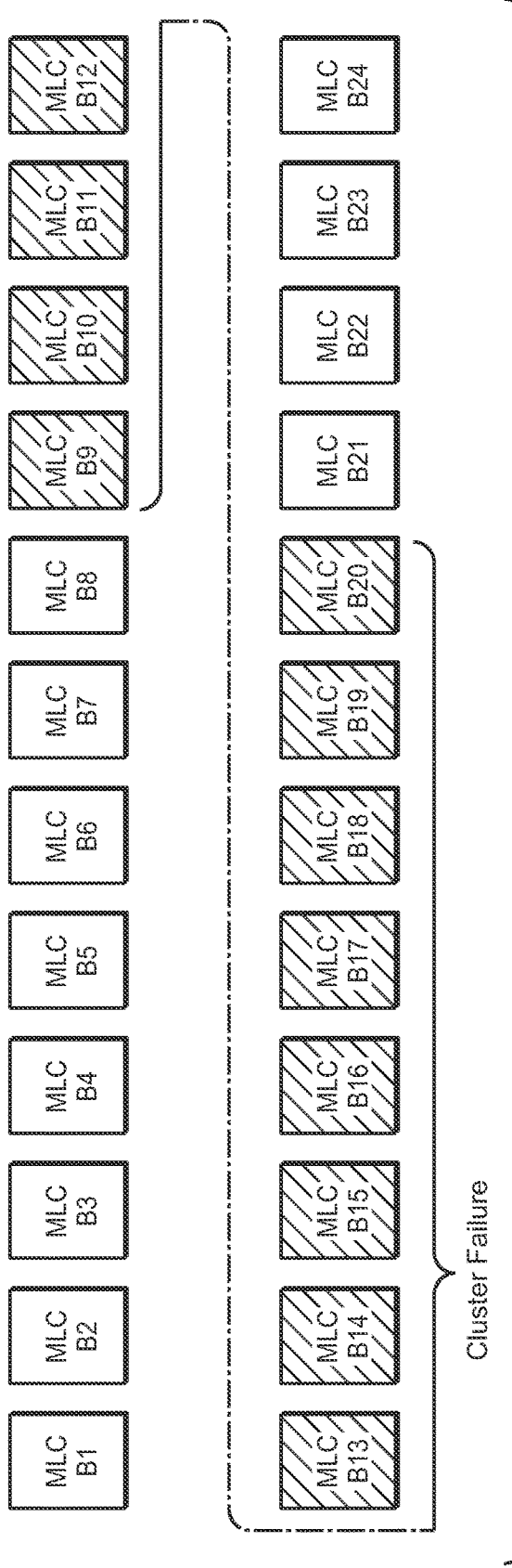
FIG. 20 shows a number of multi-state blocks that are numbered consecutively based on the physical location.
FIG. 21 is an example of a free block list (FBL) having a string of bad blocks.

A cluster failure is when a region on the memory array of a number of physically adjacent blocks are completely bad or partially bad and all the blocks in the cluster result in some kind of error (such as a program failure or an enhanced post-write read type (EPWR) after data is written to these blocks. FIG. 20 illustrates this schematically.

FIG. 20 shows a number of, in this example, multi-state (MLC) blocks, B1-B24, that are numbered consecutively based on the physical location. The hatching on some of the blocks is used to indicate a bad, or partially bad, block (as with block MLC B9), while the blocks without such hatching (as with block MLC B8) are blocks that are currently considered as good. When performing a write operation to a new block, the memory system needs to select free blocks from the memory chip or chips and one way to do this is for the controller to maintain a free block list (FBL). The controller will then select one block from the FBL for writing and replace it in the FBL with another unused block (either previously unwritten or without current data). If, when writing the block from the FBL, the programming fails or does not pass a post-write verify, the block is marked as bad and mapped out and a new block is selected from the FBL for the write. However, if the blocks for the list are selected consecutively from the same area and this area and this area is the location of a cluster failure, the FBL will have a string of bad blocks, such as illustrated in FIG. 21, leads to series of write failures and a serious impact on device performance.

One way to deal with cluster failures is to screen fresh devices to determine bad or potentially bad blocks or block clusters; however, this can reduce memory yield. Additionally, some failures may only occur after a device has been in operation for some time and may not be readily detectable when a device is fresh. In either case, if a system detects these block failures during a write operation, if may keep trying the blocks from the free block list one after another until it succeeds, which can put the system at risk of running out of blocks due to back to back program failures or EPWR failures or violating the protocol timeout even it succeeds in finding good lock after multiple failures of failures. This can particularly be the case in a folding operation that experiences multiple MLC write failures, which can lead to running out of binary source blocks.

Figure 22:
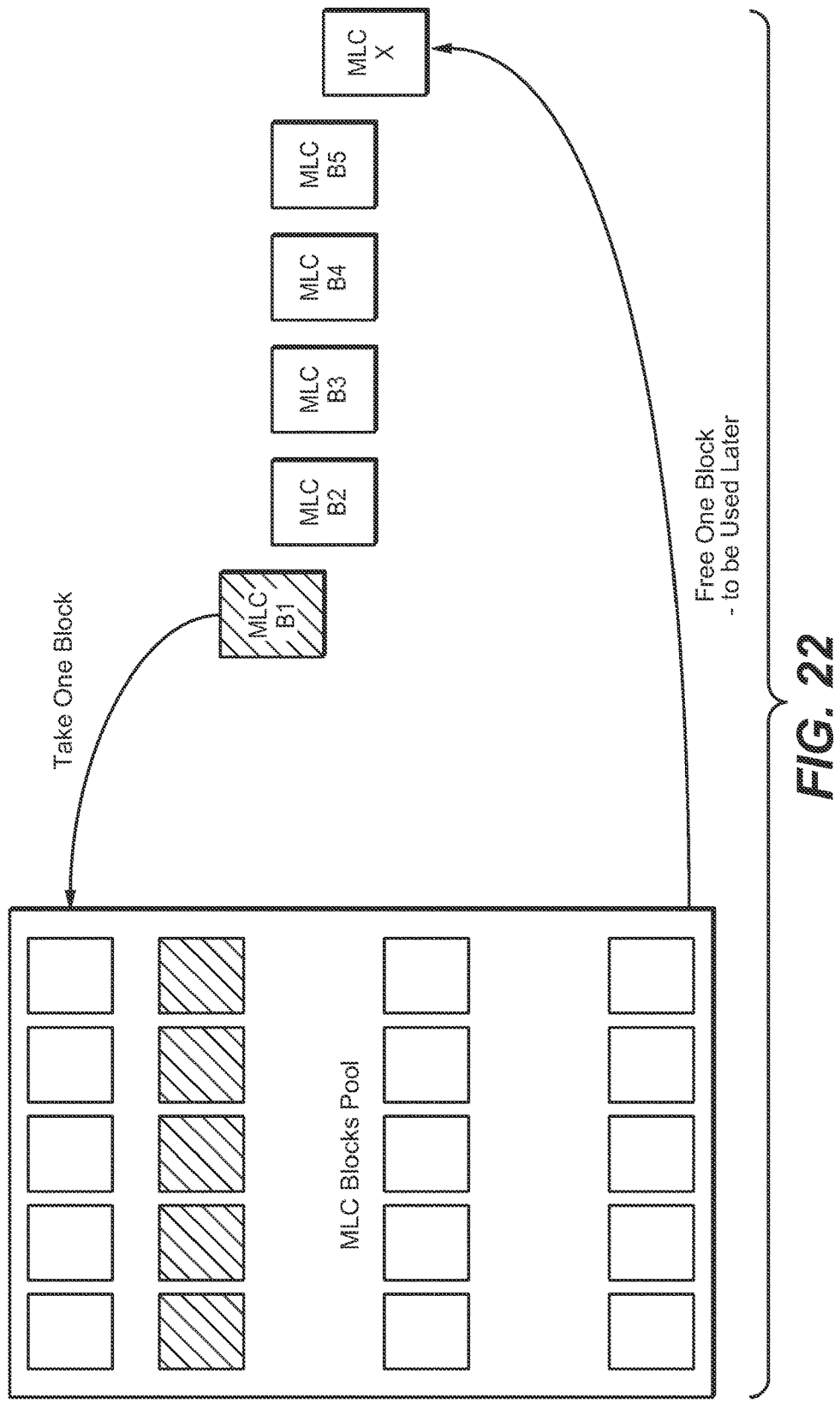
FIG. 22 illustrates the assembly of, and assign from, a free block list where the possibility of cluster errors is not taken into account.

As discussed above, a typical FBL block allocation scheme that relies on taking one block from FBL and releasing one block to the FBL, thereby maintaining a number of blocks as free and ready to be allocated in case the system requires any free block. This sort of scheme does not take account of cluster failures and a lot of consecutive errors can happen during run time. FIG. 22 illustrates the situation for a group of MLC blocks. A block with the hatching (diagonal lines) is supposed to be a bad block, either due to grown defects after usage or at time zero. The system takes one free block from the FBL and release one free block (meaning the block does not have any valid data and can be erased and reused). On the left hand side the "MLC Blocks Pool" represents all of the blocks in the MLC pool and some of them can be free blocks and some of them can be the blocks with valid data. In this pool, some blocks may grown bad blocks as well. If the system takes one block from the FBL, it will need to release one block to the FBL and only a free block from this MLC pool can be released to the FBL. As the system does not have any protection, a bad block can be released to the FBL and subsequently the FBL could become full with bad blocks, and resulting in cluster failure. If a Block X turns out to be a bad block and if it belongs to a cluster, then soon the MLC, in this example, FBL will be filled with bad blocks and eventually all of these blocks will result in a write failure, which, in the case of a folding operation, may lead the system to run hence of free blocks in the SLC pool.

To improve upon this situation, the exemplary embodiments described in this section use an algorithm that modifies the block allocation scheme to the FBL and taking care of blocks released to MLC FBL in case of any failure. For example, a device's blocks can be divided into various zones as shown in FIG. 23. In this example, each zone has 10 MLC blocks. The first zone is shown to have a few bad blocks, but is mostly good; all of Zone 2 is subject to a cluster failure; and the (partially shown) Zone 3 is all good, with subsequent zones nor represented in this figure.

The FBL is then constructed in such a manner that it tries to minimize having the multiple MLC blocks from the same zone. For example, one block is allocated to MLC FBL from each zone or from a set of zones depending on MLC FBL size. This is shown in FIG. 24, where a FBL has 5 blocks, one from each of the first 5 zones. The block B11 is bad, due to the cluster failure, but is then followed by blocks from other zones away from the failure. This could be an initial FBL, with the replacement of block in the FBL continuing cyclically through the zones, where if a zone has no available blocks, it can be skipped on that cycle.

Figure 25:
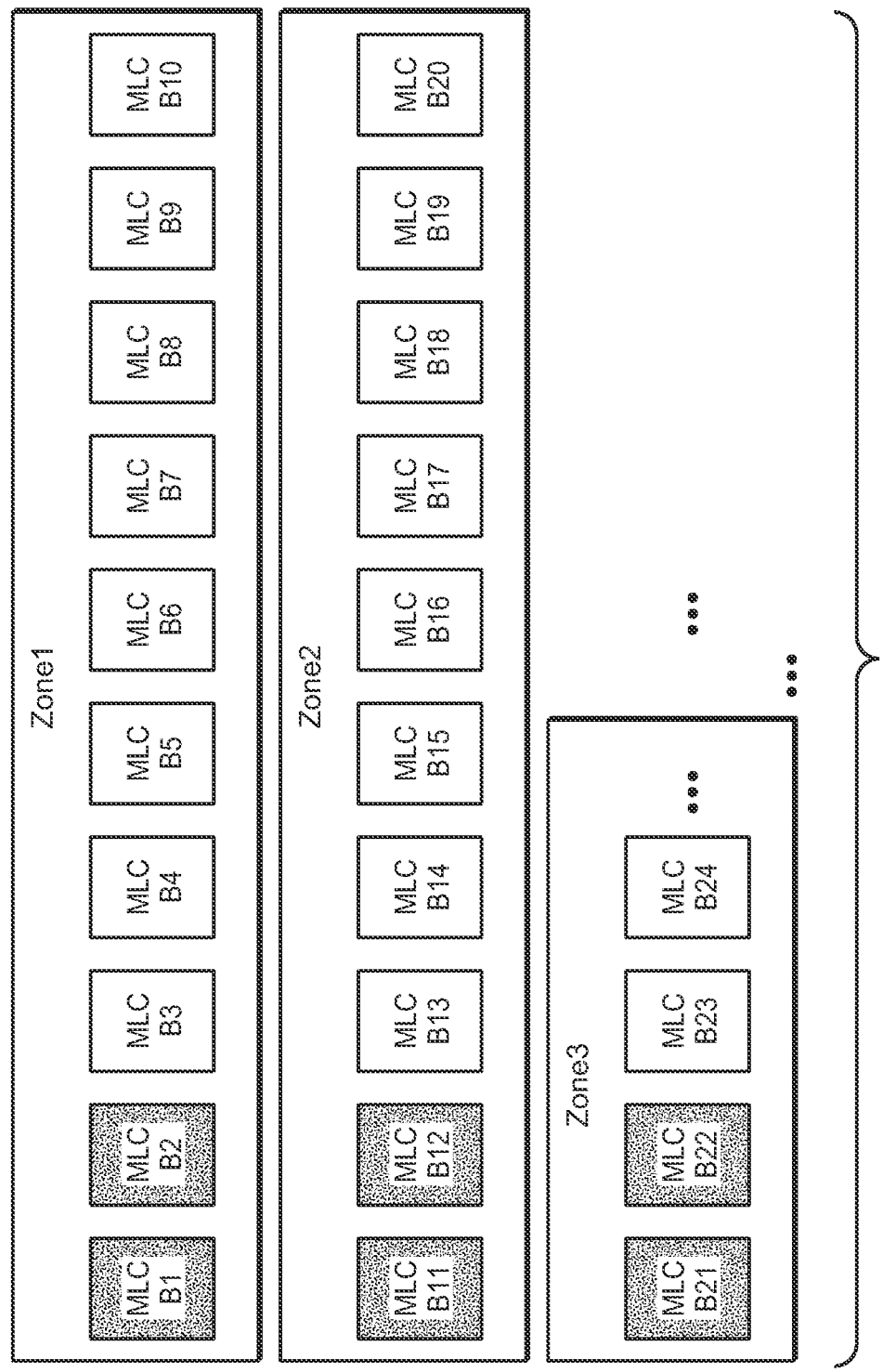
FIG. 25 shows a device whose blocks are arranged into zones for the case where the zones have an equal distribution of writes.

This is illustrated in FIG. 25, where once the FBL is constructed as described in FIG. 24, the sequential writes to device are distributed as shown in the diagram of FIG. 25, shown for the case where each zone has equal distribution of writes, where the dark shading indicates a written block.

Figure 26:
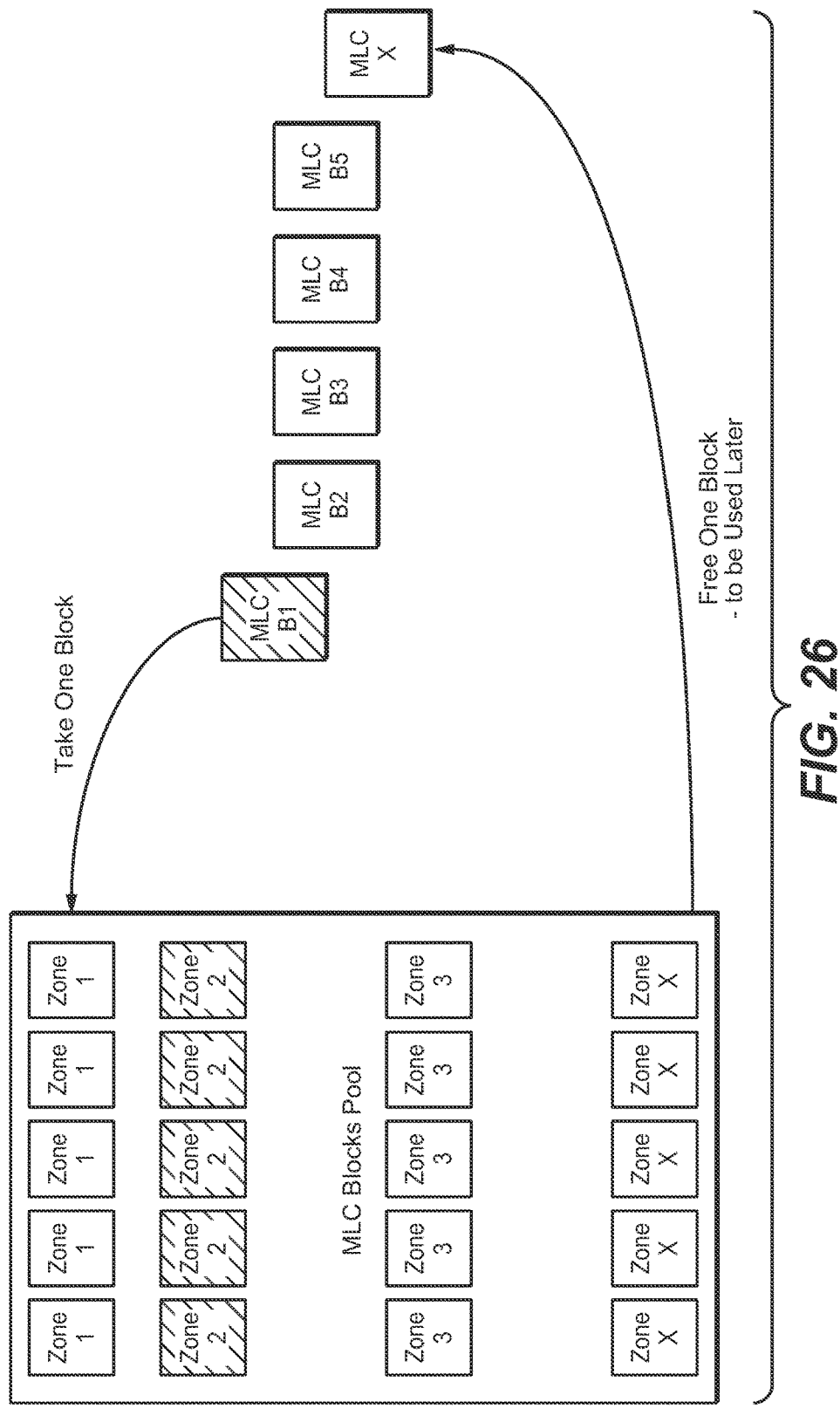
FIG. 26 looks at a technique for handling cluster failures during run time.

FIG. 26 looks at a technique for handling cluster failures during run time, where this can be combined with cyclical construction of the free block list as well as with a FBL that is not based on a cyclical repopulation of FBL elements. After a block B1 is allocated from the MLC (in this example) FBL and a write failure for this block is detected, a new block (such as B2) will be selected from the FBL to use for the write and a new block is released to FBL. While releasing the block to the FBL, a block is picked and released from a zone other than the zone from which the bad block that just failed was taken from. For instance, if the bad block B1 was taken from zone 2, the released block is taken from a different zone X. Once the new block X is chosen from different zone the chances of block X being in same cluster are minimized.

Figure 27:
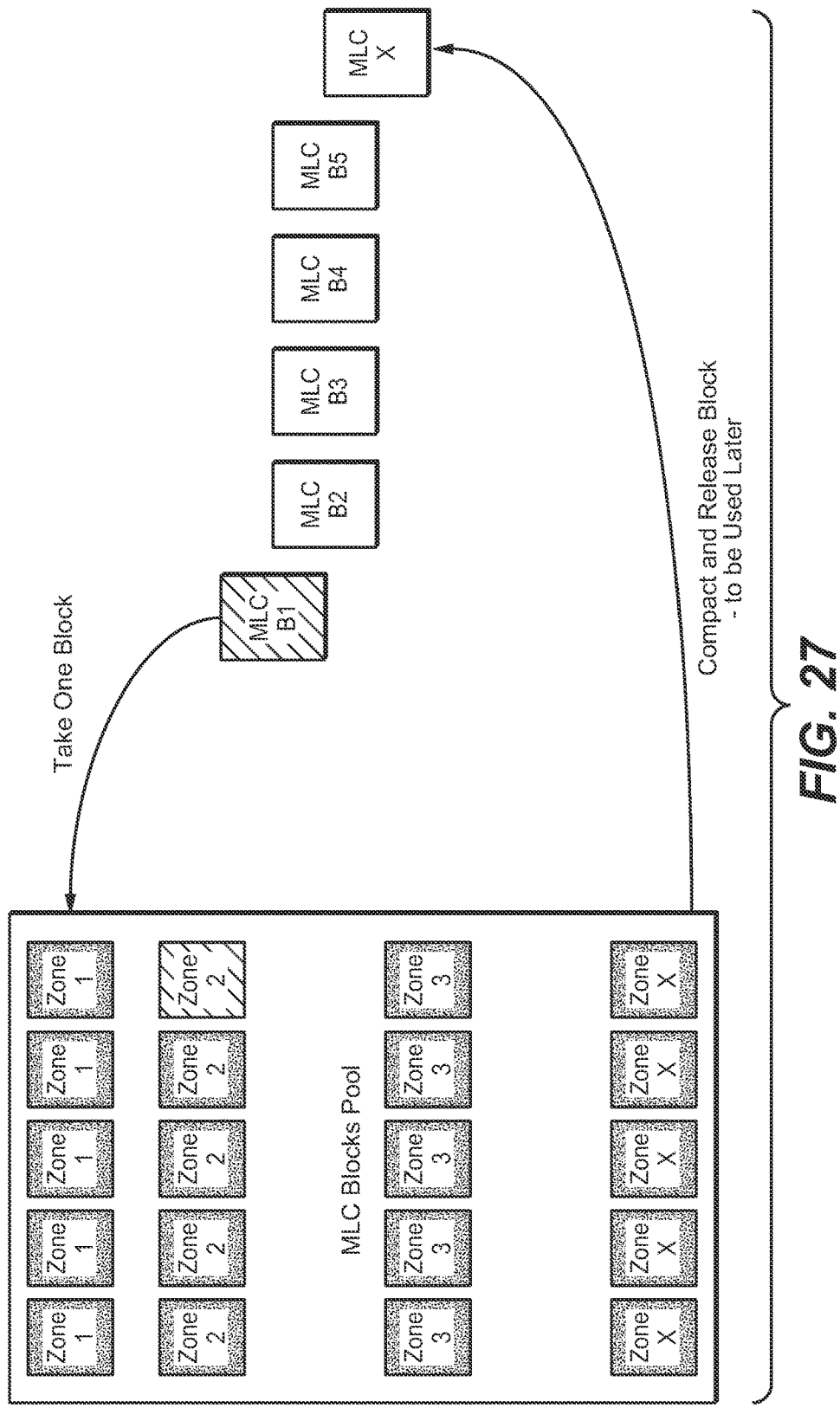
FIG. 27 illustrates the handling of cluster failures during compaction or device defragmentation.

The selection of a block from the FBL can be both for writes of host data or system data, but can also be for the writing of data from housekeeping operations internal to the memory system, such as for MLC compaction or the defragmented of a device. For example, once a device is fragmented, a block is chosen to be freed up and MLC compaction tries to free up the block so that free blocks are maintained in all the zones. A free block from another zone is released to the FBL thus minimizing the likelihood of a cluster failure happening during run time. This is illustrated schematically in FIG. 27, where the shading indicates a block holding data.

The techniques presented in this section for generating a free block list can help to avoid cluster failures leading to back to back write errors of blocks. Although generally useful for both binary and MLC write operations, the process can be particularly beneficial when performing the sort of folding operations described in earlier sections, avoiding "re-fold" and reducing the amount of write amplification. In the folding example, minimizing the frequency of post-write read, or EPWR (enhanced post-write read), errors results in less MLC data being recycled through SLC blocks, improving the endurance of these binary blocks. Device yield is also improved as a memory with cluster failures can still be used through improved management of the defective blocks. As the technique can be implemented with a fairly minimal impact on the controller's RAM for keeping track of the zones, it is readily incorporated into controllers without modifying of RAM requirements.

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto It is claimed:
1. A method, comprising:
  accessing an array of non-volatile memory cells including physical zones, each physical zone including a plurality of blocks physically located adjacent to others of the blocks within the physical zone, wherein two or more of the physical zones are within a same plane;
  constructing a free block list comprising blocks that are available for use in write operations, the free block list constructed such that adjacent blocks in the free block list correspond to different ones of the physical zones;
  choosing a first block from the free block list for a write operation; and
  repopulating the free block list responsive to the write operation, the repopulating comprising selecting a second block from among the physical zones;
  wherein the second block is selected such that the adjacent blocks in the free block list correspond to different ones of the physical zones.

2. The method of claim 1, further comprising choosing a third block from the free block list in response to a failure pertaining to the write operation, the third block corresponding to a physical zone different from a physical zone corresponding to the first block.

3. The method of claim 1, further comprising:
determining that one or more blocks of the plurality of blocks are defective; and
excluding the defective blocks from the free block list.

4. The method of claim 1, wherein the write operation is a multi-state programming operation.

5. The method of claim 4, wherein the multi-state programming operation is performed as part of an on-chip data folding operation.

6. The method of claim 1, wherein the write operation is a binary programming operation.

7. The method of claim 1, wherein constructing the free block list comprises selecting blocks to include in the free block list from the physical zones such that the blocks selected for inclusion in the free block list are approximately equally distributed among the physical zones.

8. The method of claim 1, wherein the write operation comprises one or more of: storing data received from a host within the first block and relocating data within the array.

9. The method of claim 1, wherein operations for accessing the array, constructing the free block list, choosing the first block from the free block list for the write operation, and repopulating the free block list responsive to the write operation are performed by a controller circuit operatively coupled to the array.

10. The method of claim 1, wherein the array is embodied within a monolithic semiconductor memory device, and wherein the non-volatile memory cells of the array are arranged in a two-dimensional array.

11. The method of claim 1, wherein:
the non-volatile memory cells are arranged in multiple physical levels above a silicon substrate, and
each non-volatile memory cell comprises a respective charge storage medium.

12. The method of claim 1, further comprising:
determining that a first physical zone does not include a non-defective block without valid data; and
performing a data relocation operation to relocate valid data from one or more non-defective blocks within the first physical zone in response to the determining.

13. The method of claim 1, further comprising:
determining that a first physical zone does not comprise a block that is available for use in write operations; and
performing a data compaction operation to provide the first physical zone with one or more blocks that are available for use in write operations in response to the determining.

14. A memory system, comprising:
a first array of non-volatile memory cells including physical zones, each of the physical zones including a plurality of blocks physically located adjacent to others of the blocks within the same physical zone, at least two of the physical zones corresponding to a same plane; and
a controller circuit operably coupled to the array of non-volatile memory cells and configured to:
construct a free block list configured to identify blocks that are free for selection in write operations, the free block list constructed such that neighboring blocks within the free block list correspond to different ones of the physical zones;
select a first block from the free block list for a write operation; and
select a second block from the physical zones for repopulating the free block list responsive to the write operation,
wherein the second block is selected from the physical zones such that the neighboring blocks within the free block list correspond to different ones of the physical zones.

15. The memory system of claim 14, wherein the non-volatile memory cells are arranged in a two-dimensional array.

16. The memory system of claim 14, wherein the array is part of a monolithic semiconductor memory device having non-volatile memory cells arranged in multiple physical levels above a silicon substrate.

17. The memory system of claim 14, wherein the controller circuit is further configured to perform a data compaction operation in response to identifying a physical zone that does not comprise a block that is free for selection in write operations, the data compaction operation configured to provide the identified physical zone with one or more blocks that are free for selection in write operations.

18. The memory system of claim 14, wherein the controller circuit is further configured to select a third block to service the write operation responsive to a failure pertaining to the first block, the third block selected from the free block list such that the third block corresponds to a physical zone different from a physical zone of the first block.

19. A memory device, comprising:
a plurality of memory blocks, each memory block comprising a plurality of non-volatile memory cells; and
a controller configured to:
divide the memory blocks into a plurality of zones, each zone comprising a plurality of physically proximate memory blocks, wherein two or more zones are disposed within a same plane; and
maintain a free block list that identifies memory blocks that are currently available for use in write operations, the free block list maintained such that contiguous memory blocks within the free block list correspond to different ones of the zones, wherein maintaining the free block list further comprises:
removing a first memory block from the free block list in response to selection of the first memory block for use in a write operation, and
selecting a second memory block for inclusion in the free block list in response to the removing, the second memory block selected from among the zones such that the contiguous memory blocks within the free block list correspond to different ones of the zones.

20. The memory device of claim 19, further comprising a memory die, wherein the memory die comprises memory blocks of the two or more zones disposed within the same plane, and wherein the memory die comprises one of a single-plane memory die and a multi-plane memory die.

* * * * *